(12) United States Patent
Wang et al.

(10) Patent No.: US 10,818,505 B2
(45) Date of Patent: Oct. 27, 2020

(54) SELF-ALIGNED DOUBLE PATTERNING PROCESS AND SEMICONDUCTOR STRUCTURE FORMED USING THEREOF

(71) Applicant: Taiwan Semiconductor Manufacturing Co., Ltd., Hsin-Chu (TW)

(72) Inventors: Yu-Wen Wang, Hsin-Chu (TW); Kuo-Chyuan Tzeng, Chu-Pei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/239,751

(22) Filed: Jan. 4, 2019

(65) Prior Publication Data

US 2020/0058514 A1 Feb. 20, 2020

Related U.S. Application Data

(60) Provisional application No. 62/764,740, filed on Aug. 15, 2018.

(51) Int. Cl.
*H01L 21/768* (2006.01)
*H01L 21/311* (2006.01)
*H01L 21/308* (2006.01)

(52) U.S. Cl.
CPC ...... *H01L 21/3086* (2013.01); *H01L 21/3081* (2013.01); *H01L 21/3088* (2013.01); *H01L 21/31144* (2013.01); *H01L 21/76816* (2013.01)

(58) Field of Classification Search
CPC ............ H01L 21/3086; H01L 21/0338; H01L 21/3088; H01L 23/528; H01L 29/06; H01L 21/32139; H01L 21/3081
See application file for complete search history.

(56) References Cited

U.S. PATENT DOCUMENTS

| | | | | |
|---|---|---|---|---|
| 5,494,853 A * | 2/1996 | Lur | ................... | H01L 21/76838 148/DIG. 137 |
| 5,924,006 A * | 7/1999 | Lur | ..................... | H01L 21/7682 257/E21.581 |
| 9,502,428 B1 | 11/2016 | Yonemochi | | |
| 2006/0046422 A1* | 3/2006 | Tran | .................... | H01L 21/0337 438/401 |
| 2008/0122125 A1* | 5/2008 | Zhou | ................... | H01L 21/0338 257/797 |
| 2008/0296732 A1* | 12/2008 | Olson | ................. | H01L 21/0334 257/618 |
| 2010/0295183 A1* | 11/2010 | Sandhu | ............. | H01L 21/32139 257/773 |

(Continued)

*Primary Examiner* — Caridad Everhart
(74) *Attorney, Agent, or Firm* — Eschweiler & Potashnik, LLC

(57) ABSTRACT

A method comprises following steps. A first mandrel is formed over a target layer over a substrate, wherein the first mandrel comprises a mandrel island and a first mandrel strip, the mandrel island comprises a first sidewall and a second sidewall perpendicular to the first sidewall, and the first mandrel strip extends from the first sidewall of the mandrel island. A first spacer is formed along the first and second sidewalls of the mandrel island and a sidewall of the first mandrel strip. The first mandrel is removed from the target layer. The target layer is patterned when the first spacer remains over the target layer.

20 Claims, 28 Drawing Sheets

(56) References Cited

U.S. PATENT DOCUMENTS

| | | |
|---|---|---|
| 2015/0170905 A1 | 6/2015 | Tran et al. |
| 2015/0243515 A1 | 8/2015 | Yuan et al. |
| 2017/0372974 A1 | 12/2017 | Tseng et al. |

* cited by examiner

SELF-ALIGNED DOUBLE PATTERNING PROCESS AND SEMICONDUCTOR STRUCTURE FORMED USING THEREOF

CROSS-REFERENCE TO RELATED APPLICATION

This application claims priority to U.S. Provisional Application Ser. No. 62/764,740, filed Aug. 15, 2018, which is herein incorporated by reference.

BACKGROUND

With the increasing down-scaling of semiconductor devices, various processing techniques, such as photolithography are adapted to allow for the manufacture of devices with increasingly smaller dimensions. However, as semiconductor processes require smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
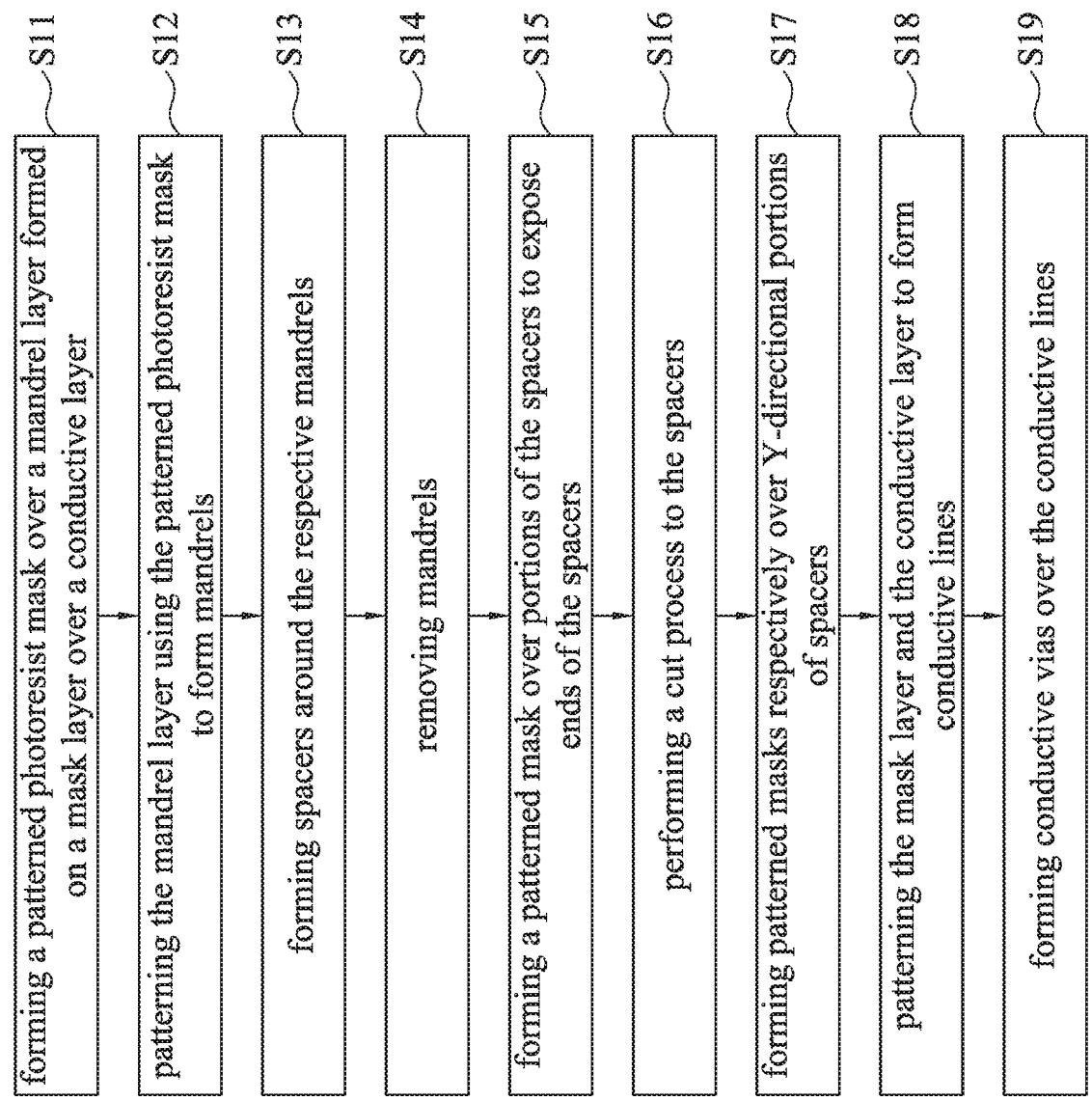
FIG. 1 is an exemplary method for fabrication of a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is an exemplary method M1 for fabrication of a semiconductor structure according to some embodiments of the present disclosure. The method M1 includes a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable.

FIGS. 2A-10B illustrate various intermediate stages of the method M1 in accordance with some embodiments, where an "A" figure represents a top view, and a "B" figure represents a cross-sectional view along a B-B line of the respective "A" figure.

Figure 2A:
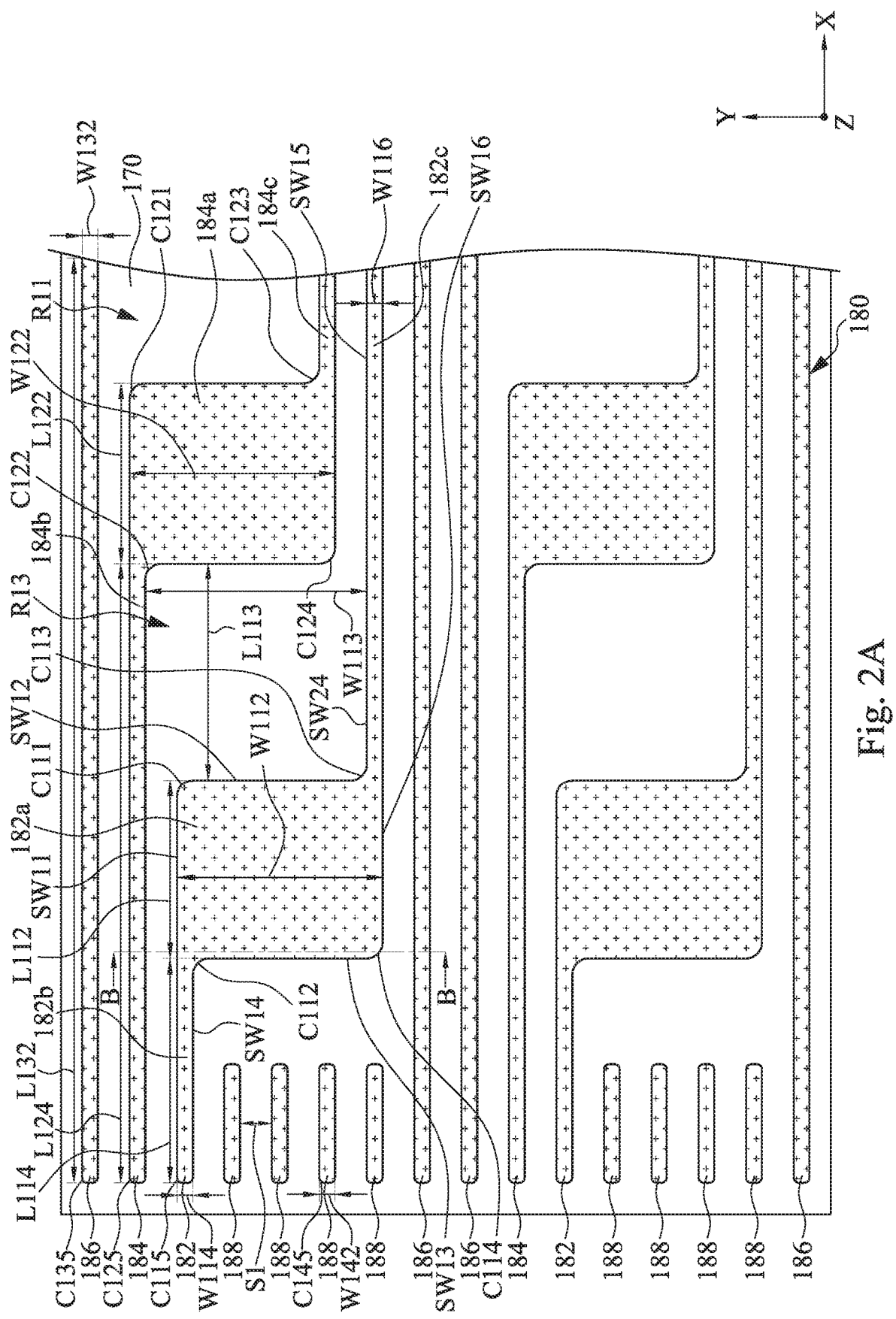
FIGS. 2A-10B illustrate various intermediate stages of the method of FIG. 1 in accordance with some embodiments.
Figure 2B:
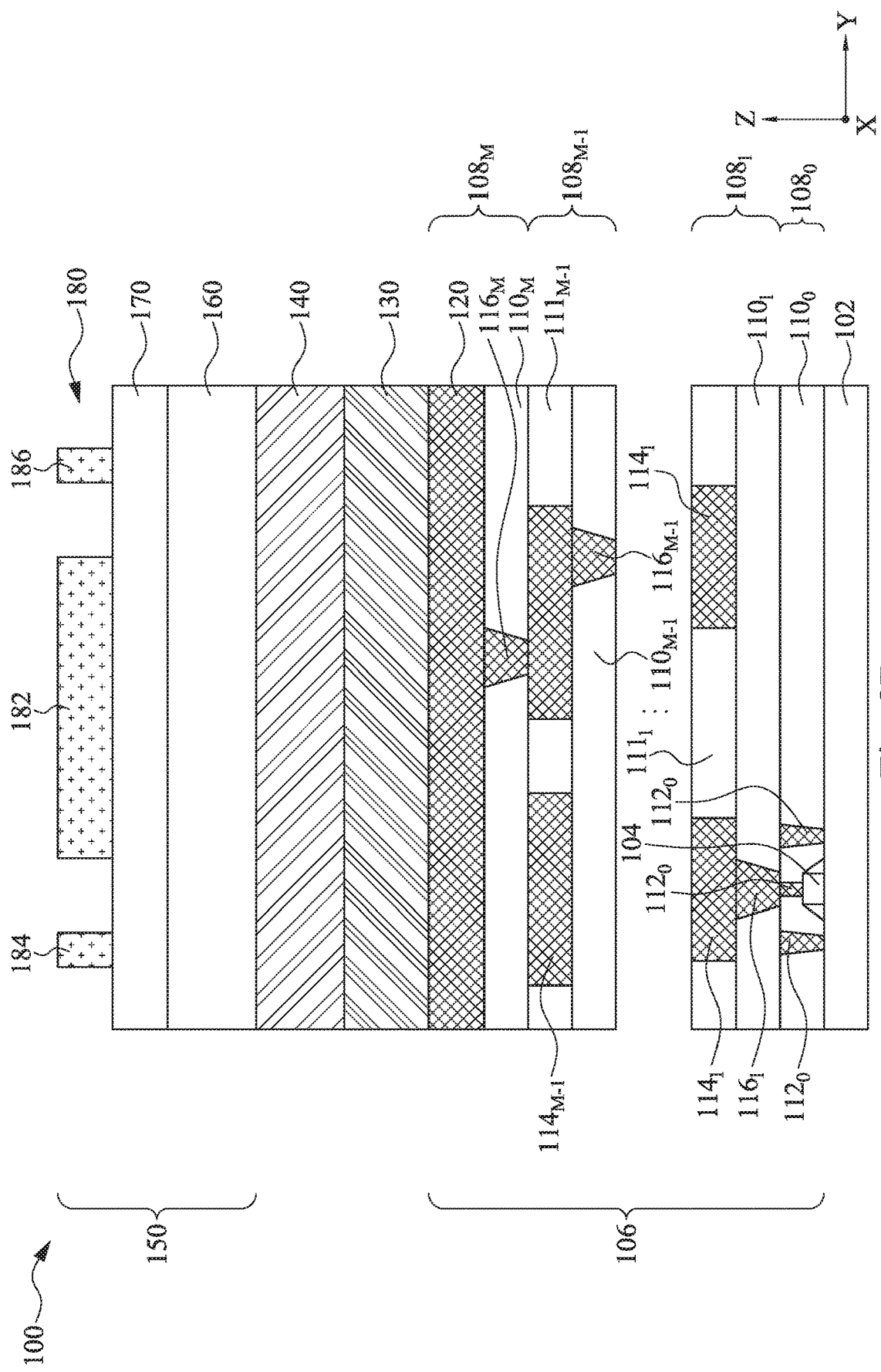

The method M1 begins at block S11 where a patterned photoresist mask is formed over a mandrel layer over a target layer of a semiconductor substrate. Referring to FIGS. 2A and 2B, in some embodiments of block S11, the semiconductor structure 100 may be an intermediate structure of an integrated circuit manufacturing process. In some embodiments, the semiconductor structure 100 may comprise a substrate 102. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 102 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more active and/or passive devices 104 (illustrated in FIG. 2B as a single transistor) are formed on the substrate 102. The one or more active and/or passive devices 104 may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also formed as appropriate for a given application.

In some embodiments, an interconnect structure 106 is formed over the one or more active and/or passive devices 104 and the substrate 102. The interconnect structure 106 electrically interconnects the one or more active and/or passive devices 104 to form functional electrical circuits within the semiconductor structure 100. The interconnect structure 106 may comprise one or more metallization layers $108_0$ to $108_M$, wherein M is the number of the one or more metallization layers, and in this example there are M+1 metallization layers. In some embodiments, the value of M may vary according to design specifications of the semiconductor structure 100. In what follows, the one or more metallization layers $108_0$ to $108_M$ may also be collectively referred to as the one or more metallization layers 108. The metallization layers $108_0$ to $108_M$ comprise dielectric layers $110_0$ to $110_M$, respectively. The metallization layers $108_1$ to $108_{M-1}$ comprise dielectric layers $111_1$ to $111_{M-1}$, respectively. The dielectric layers $111_1$ to $111_{M-1}$ are formed over the corresponding dielectric layers $110_1$ to $110_{M-1}$. In some embodiments, the formation of the interconnect structure 106 can be referred to as a back-end-of-line (BEOL) process.

In some embodiments, the dielectric layer $110_0$ is an inter-layer dielectric (ILD) layer, and the dielectric layers $110_1$ to $110_M$ and dielectric layers $111_1$ to $111_{M-1}$ are inter-metal dielectric (IMD) layers. The ILD layer and the IMD layers may include low-k dielectric materials having k values, for example, lower than about 4.0 or even 2.0 disposed between such conductive features. In some embodiments, the ILD layer and IMD layers may be made of, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, formed by any suitable method, such as spin-on coating, chemical vapor deposition (CVD), plasma-enhanced CVD (PECVD), or the like.

In some embodiments, the metallization layer $108_0$ comprises conductive plugs $112_0$ through the dielectric layer $111_0$, and the metallization layers $108_1$ to $108_{M-1}$ comprise one or more conductive interconnects, such as conductive lines $114_1$ to $114_{M-1}$ respectively in dielectric layers $111_1$ to $111_{M-1}$ and conductive vias $116_1$ to $116_{M-1}$ respectively in dielectric layers $110_1$ to $110_{M-1}$. The conductive plugs $112_0$ electrically couple the one or more active and/or passive devices 104 to the conductive lines $114_1$ to $114_{M-1}$ and the conductive vias $116_1$ to $116_{M-1}$. The metallization layer $108_M$ comprises conductive via $116_M$ through the dielectric layer $110_M$, and a conductive layer 120 to be patterned as conductive lines in following steps.

In some embodiments, the conductive plugs $112_0$, the conductive lines $114_1$ to $114_{M-1}$ and the conductive vias $116_1$ to $116_M$ may be formed using any suitable method, such as damascene, dual damascene, or the like. The conductive plugs $112_0$, the conductive lines $114_1$ to $114_{M-1}$ and the conductive vias $116_1$ to $116_{M-1}$ may comprise conductive materials such as copper, aluminum, tungsten, combinations thereof, or the like. In some embodiments, the conductive plugs $112_0$, the conductive lines $114_1$ to $114_{M-1}$, and the conductive vias $116_1$ to $116_M$ may further comprise one or more barrier/adhesion layers (not shown) to protect the respective dielectric layers $110_0$ to $110_{M-1}$ and $111_0$ to $111_{M-1}$ and from diffusion and metallic poisoning. The one or more barrier/adhesion layers may comprise titanium, titanium nitride, tantalum, tantalum nitride, or the like, and may be formed using physical vapor deposition (PVD), CVD, ALD, or the like.

The conductive layer 120 is formed using, for example, PVD, CVD, ALD or the like. The conductive layer 120 may include the same material as the conductive lines $114_1$ to $114_{M-1}$. For example, the conductive layer 120 may include conductive materials such as copper, aluminum, titanium, tungsten, combinations thereof, or the like. A hard mask layer 130 is formed over the conductive layer 120. The hard mask layer 130 and the conductive layer 120 will be patterned, as described below in greater detail. The patterning process will result in conductive lines 210-260 in the conductive layer 120' (not illustrated in FIGS. 2A and 2B, see FIGS. 10A and 10B). Patterning the conductive layer 120 includes a self-aligned double patterning (SADP) process that will be discussed in detail below, and thus the conductive layer 120 may also be referred to as a target layer of the SADP process.

In some embodiments, the hard mask layer 130 may be a single-layered structure or a multi-layered structure. In some embodiments where the hard mask layer 130 is a multi-layered structure, the hard mask layer 130 may include an anti-reflective coating (ARC) over the conductive layer 120, a first mask layer over the ARC and a second mask layer over the first mask layer.

The ARC prevents radiation in subsequent photolithographic processes from reflecting off layers below and interfering with the exposure process. In some embodiments, the ARC is a nitrogen-free ARC (NFARC) and is made of a silicon-rich oxide (SRO), silicon oxycarbide, the like, or a combination thereof, and is formed using CVD, PECVD, the like, or a combination thereof. The ARC may be also used as an etch stop layer (ESL) to aid in patterning the first and second mask layers thereon. In some embodiments, the first mask layer may be a metal hard mask layer and the second mask layer may be a dielectric hard mask layer. The first mask layer may comprise titanium nitride, titanium oxide, the like, or a combination thereof, and may be formed using CVD, PVD, ALD, the like, or a combination thereof. The second mask layer may comprise tetraethyl orthosilicate (TEOS), carbon-doped silicon oxide (SiCOH), $SiO_xC_y$, the like, or a combination thereof, and may be formed using spin-on coating, CVD, ALD, the like, or a combination thereof.

A mandrel layer 140 is formed over the hard mask layer 130. The mandrel layer 140 may be used to form mandrels (not illustrated in FIGS. 2A and 2B, see FIGS. 3A and 3B). The mandrel layer 140 may be a masking material such as polysilicon, amorphous silicon, amorphous carbon, a metal film such as $AlO_xN_y$, the like, or a combination thereof or any other material that may be patterned and selectively removed. The mandrel layer 140 may be formed using a process such as CVD, ALD, the like, or a combination thereof.

A tri-layer photoresist mask 150 is formed over the mandrel layer 140 to pattern the mandrel layer 140 in a following step. In some embodiments, the tri-layer photoresist mask 150 comprises a bottom layer 160, a middle layer 170 over the bottom layer 160, and a top layer 180 over the middle layer 170. In some embodiments, the bottom layer 160 may comprise an organic material, such as a spin-on carbon (SOC) material, or the like, and may be formed using spin-on coating, CVD, ALD, or the like. The middle layer 170 may comprise an inorganic material, which may be a nitride (such as SiN, TiN, TaN, or the like), an oxynitride (such as SiON), an oxide (such as silicon oxide), or the like, and may be formed using CVD, ALD, or the like. The top layer 180 may comprise an organic material, such as a photoresist material, and may be formed using a spin-on coating, or the like. In some embodiments, the middle layer 170 has a higher etch rate than the top layer 180, and the top layer 180 can be used as an etching mask for patterning of the middle layer 170. In some embodiments, the bottom layer 160 has a higher etch rate than the middle layer 170, and the middle layer 170 can be used as an etching mask for patterning of the bottom layer 160.

The top layer 180 of the tri-layer photoresist mask 150 is patterned, using suitable photolithography techniques, to form a plurality of first patterns 182, second patterns 184, third patterns 186 and fourth patterns 188. In some embodiments where the top layer 180 comprises a photoresist material, the photoresist material is irradiated (exposed) and developed to remove portions of the photoresist material. For example, a photomask (not shown) may be disposed over the top photoresist layer 180, which may then be exposed to a radiation beam which may be ultraviolet (UV) or an excimer laser such as a Krypton Fluoride (KrF) excimer laser, or an Argon Fluoride (ArF) excimer laser. Exposure of the top photoresist layer 180 may be performed using an immersion lithography system to increase resolution and decrease the minimum achievable pitch. A bake or cure operation may be performed to harden the top photoresist layer 180, and a developer may be used to remove either the exposed or unexposed portions of the top photoresist layer 180 depending on whether a positive or negative resist is used. Thus, the first, second, third patterns and fourth patterns 182, 184, 186 and 188 illustrated in FIG. 2A are formed in the top photoresist layer 180.

As illustrated in FIG. 2A, the first and second patterns 182 and 184 are arranged immediately adjacent to each other. Stated differently, the first and second patterns 182 and 184 are free from the third and fourth patterns 186 and 188 therebetween. The third pattern 186 resembles a strip extending in X-direction, and the fourth pattern 188 resembles a strip shorter than the third pattern 186 in X-direction. Therefore, the third pattern 186 can be referred to as a long strip pattern, and the fourth pattern 188 can be referred to as a short strip pattern. The first and second patterns 182 and 184 have different shapes from the strip patterns 186 and 188. Shapes of the first and second patterns 182 and 184 are designed to form photoresist-free regions R11 and R13 in the patterned photoresist layer 180, as described below in greater detail.

In some embodiments, the first pattern 182 includes a first portion 182a, and second and third portions 182b and 182c extending in X-direction respectively from opposites sidewalls of the first portion 182a. The first portion 182a resembles a rectangular island and thus can be referred to as a photoresist island 182a, and the second and third portions 182b and 182c resemble strips extending from diagonal corners of the rectangular photoresist island 182a and thus can be referred to as photoresist strips 182b and 182c. The second pattern 184 is arranged above the first pattern 182 in top view, and has substantially the same shape as the first pattern 182. In greater detail, the second pattern 184 includes a photoresist island 184a, and photoresist strips 184b and 184c extending in X-direction respectively from opposites sidewalls of the photoresist island 184a.

As illustrated in FIG. 2A, the photoresist island 182a of the first pattern 182 has a length L112 in X-direction, the photoresist strip 182b of the first pattern 182 has a length L114 in X-direction, and the strip portion 184b of the second pattern 184 has a length L124 in X-direction. A summation of the length L112 of the photoresist island 182a and the length L114 of the photoresist strip 182b is less than the length L124 of the photoresist strip 184b of the second pattern 184. In this manner, a region R13 vertically between the photoresist strip 184b of the second pattern 184 and the photoresist strip 182c of the first pattern 182 and horizontally between the photoresist islands 182a and 184a of the first and second patterns 182 and 184 is free from other photoresist patterns, and thus the region R13 can be referred to as a photoresist-free region R13. The photoresist-free region R13 has a length L113 in X-direction and a width W113 in Y direction. In some embodiments, the length L113 of the photoresist-free region R13 is in a range from about 200 nm to about 1000 nm, and the width W113 is in a range from about 200 nm to about 1000 nm as well. In some embodiments, the photoresist-free region R11 has the same size as the photoresist-free region R13.

The photoresist island 184a of the second pattern 184 has a length L122 in X-direction, and the photoresist strip 186 has a length L132 in X-direction. A summation of the length L122 of the photoresist island 184a and the length L124 of the photoresist strip 184b is less than the length L132 of the photoresist strip 186. In this manner, a region R11 vertically between the photoresist strips 186 and 184c is free from other photoresist patterns, and thus the region R11 can be referred to as a photoresist-free region R11.

The photoresist island 182a has a width W112 in Y-direction, the photoresist strips 182b and 182c respectively have widths W114 and W116 in Y-direction, the photoresist strips 186 and 188 respectively have widths W132 and W142 in Y-direction. Any neighboring two of the photoresist strips 186, 188 and the photoresist strips 182b, 184b are separated by a spacing S1. In some embodiments, the width W112 of the photoresist island 182a is greater than the widths W114 and W116 of the photoresist strips 182b and 182c, widths W132 and W142 of the photoresist strips 186 and 188, and the spacing S1. For example, in the depicted embodiments, the width W112 of the photoresist island 182a is greater than a number of (W114+3×W142+4×S1), so as to form the photoresist-free region R13 with a suitable size. Similarly, the photoresist island 184a of the second pattern 184 has a width W122 in Y-direction, and the width W122 is greater than a number of (W114+3×W142+4×S1), so as to form the photoresist-free region R11 with a suitable size. In some embodiments, the width W112 of the photoresist island 182a is in a range from about 200 nm to about 1000 nm, the width W114 of the photoresist strip 182b is in a range from about 10 nm to about 50 nm, the width W116 of the photoresist strip 182c is in a range from about 10 nm to about 50 nm, the width W132 of the photoresist strip 186 is in a range from about 10 nm to about 50 nm, the width W142 of the photoresist strip 188 is in a range from about 10 nm to about 50 nm, the width W122 of the photoresist island 184a is in a range from about 200 nm to about 1000 nm, and the spacing S1 is in a range from about 30 nm to about 50 nm. In some embodiments, the widths W114, W116, W132 and W142 of the photoresist strips 182b, 182c, 186 and 188 are substantially the same. In some embodiments, the width W112 of the photoresist island 182a is substantially the same as the width W122 of the photoresist island 184a.

In some embodiments, the photoresist patterns 182-188 have rounded (or curvy) corners and rounded ends resulting from the photolithography process. For example, the first pattern 182 includes a rounded corner C111 connecting an X-directional sidewall SW11 and a Y-directional sidewall SW12 of the photoresist island 182a, a rounded corner C112 connecting another Y-direction sidewall SW13 of the photoresist island 182a and an X-directional sidewall SW14 of the photoresist strip 182b, a rounded corner C113 connecting the Y-directional sidewall SW12 of the photoresist island 182a and an X-directional sidewall SW15 of the photoresist strip 182c, and a rounded corner C114 connecting the Y-direction sidewall SW13 and another X-direction sidewall SW16 of the photoresist island 182a. In some embodiments, the second pattern 184 includes rounded corners C121, C122, C123 and C124 similar to the respective rounded corners C111-C114, and thus description about the rounded corners C121-C124 is not repeated herein for the sake of brevity.

Moreover, the photoresist strip 182b has a rounded end C115 away from the photoresist island 182a, and the photoresist strip 182c also has a rounded end (not illustrated) away from the photoresist island 182a. The photoresist strip 184b has a rounded end C125 away from the photoresist island 184a, and the photoresist strip 184c also has a rounded end (not illustrated) away from the photoresist island 184a. The strip patterns 186 and 188 have rounded ends C135 and C145, respectively.

Figure 3A:
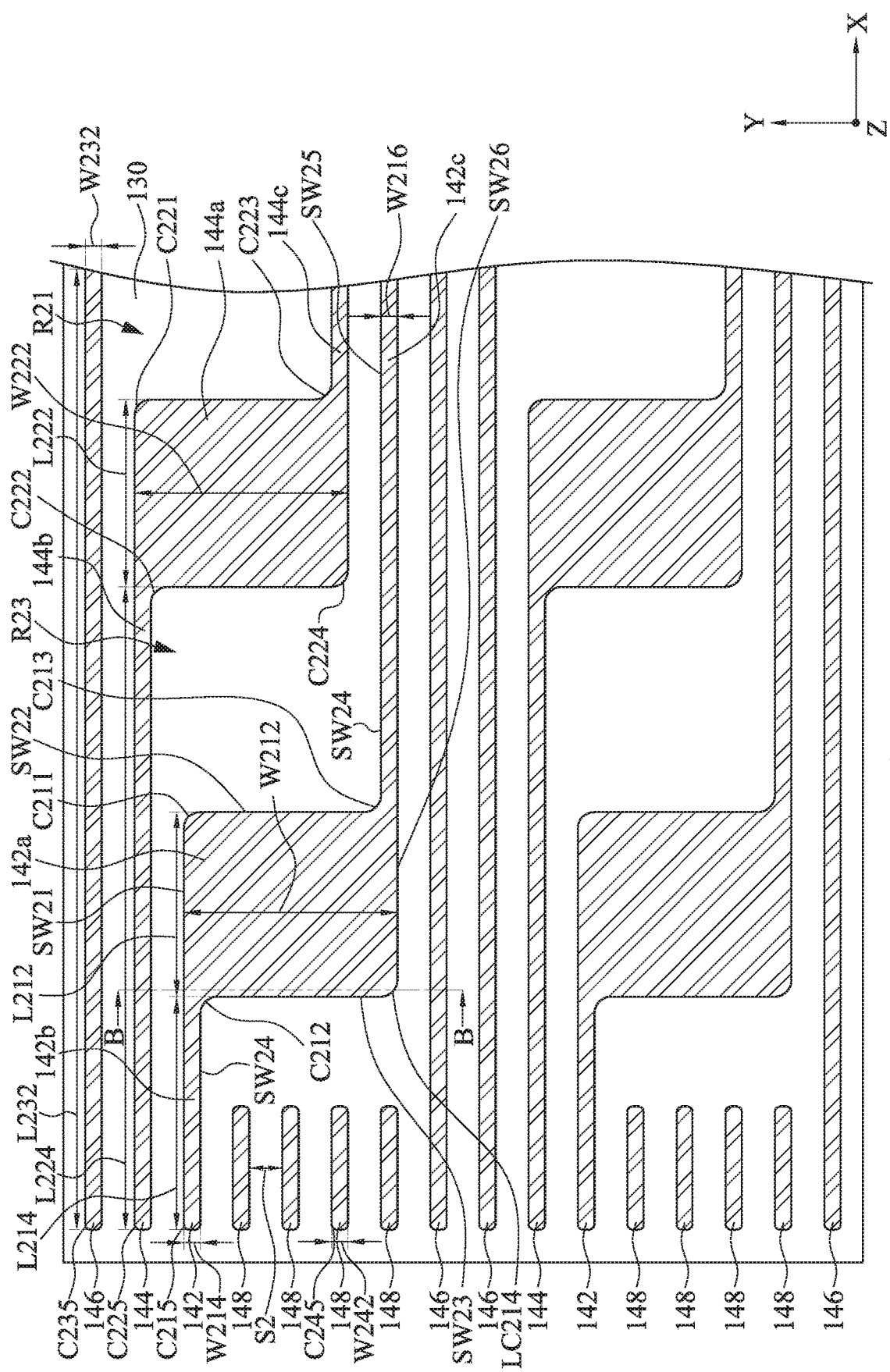
Figure 3B:
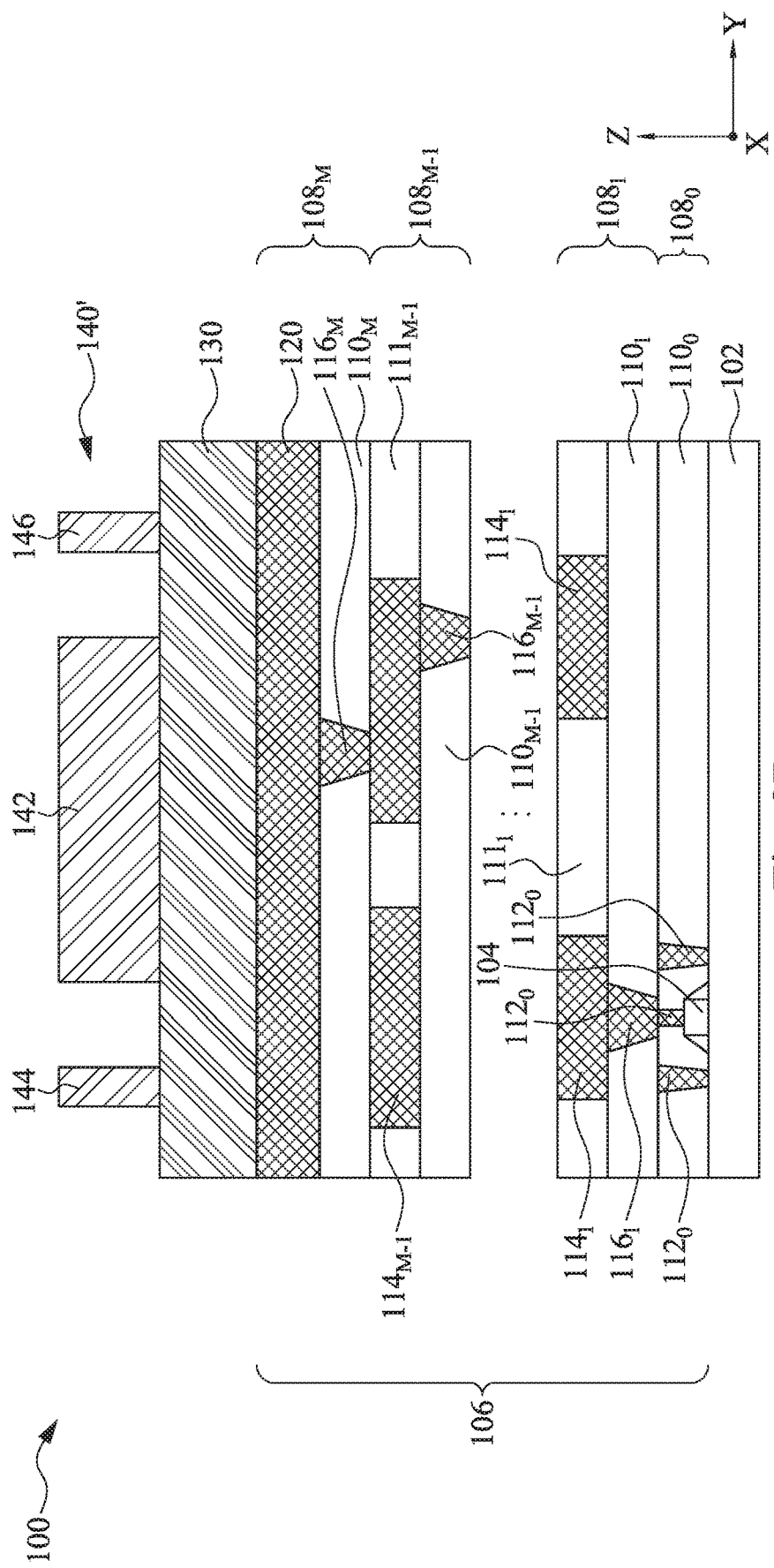

Returning to FIG. 1, the method M1 then proceeds to block S12 where the mandrel layer is patterned using the patterned photoresist mask. Referring to FIGS. 3A and 3B, in some embodiments of block S12, a patterning process is performed on the mandrel layer 140 to transfer the first, second, third and fourth patterns 182, 184, 186 and 188 in the photoresist layer 180 of the tri-layer photoresist mask 150 (see FIGS. 2A and 2B) to the mandrel layer 140, resulting in first, second, third and fourth mandrels 142, 144, 146 and 148 in the patterned mandrel layer 140'. In some embodiments, the patterning process comprises one or more etching processes, where the tri-layer photoresist mask 150 is used as an etch mask. The one or more etching processes may include wet etching processes, anisotropic dry etching processes, or combinations thereof. In some embodiments, the mandrel layer 140 is patterned by a dry etch process with etch process gases including $O_2$, $Cl_2$, HBr, He, $NF_3$, $CO_2$, $C_xH_yF_z$, Ar, $N_2$, $H_2$, the like, or a combination thereof. During the patterning process, the top layer 180, the middle layer 170, and the bottom layer 160 of the tri-layer photoresist mask 150 may be consumed. If any residue of the top layer 180, the middle layer 170, and the bottom layer 160 of the tri-layer photoresist mask 150 is left over the patterned mandrel layer 140' after the patterning processes, the residue may also be removed.

Since patterns in the tri-layer photomask 150 are transferred to the underlying mandrel layer 140, the resulting first, second, third and fourth mandrels 142, 144, 146 and 148 in the patterned mandrel layer 140' have substantially same shapes, sizes and spacing as respective the first, second, third and fourth patterns 182, 184, 186 and 188 in the top layer 180 of the tri-layer photoresist mask 150 (see FIGS. 2A and 2B), as described below in greater detail.

As illustrated in FIG. 3A, the first and second mandrels 142 and 144 are arranged immediately adjacent to each other. Stated differently, the first and second mandrels 142 and 144 are free from the third and fourth mandrels 146 and 148 therebetween. The third mandrel 146 resembles a strip extending in X-direction, and the fourth mandrel 148 resembles a strip shorter than the third mandrel 146 in X-direction. Therefore, the third mandrel 146 can be referred to as a long mandrel strip, and the fourth mandrel 148 can be referred to as a short mandrel strip. The first and second mandrels 142 and 144 have different shapes from the mandrel strips 146 and 148. Shapes of the first and second mandrels 142 and 144 are designed to form mandrel-free regions R21 and R23 in the patterned mandrel layer 140', as described below in greater detail.

In some embodiments, the first mandrel 142 includes a rectangular mandrel island 142a and mandrel strips 142b and 142c extending in X-direction respectively from diagonal corners of the rectangular mandrel island 142a. In greater detail, the X-directional mandrel strip 142b extends from a Y-directional sidewall SW23 of the mandrel island 142a, the X-directional mandrel strip 142c extends from an Y-directional sidewall SW22 of the mandrel island 142a facing away from the Y-directional sidewall SW23. The mandrel strips 142b and 142c are misaligned. Similarly, the second mandrel 144 includes a rectangular mandrel island 144a and mandrel strips 144b and 144c extending in X-direction respectively from diagonal corners of the rectangular mandrel island 144a.

As illustrated in FIG. 3A, the rectangular mandrel island 142a has a length L212 in X-direction, the mandrel strip 142b has a length L214 in X-direction, and the mandrel strip 144b has a length L224 in X-direction. A summation of the length L212 of the mandrel island 142a and the length L214 of the mandrel strip 142b is less than the length L224 of the mandrel strip 144b. In this manner, a region R23 vertically between the mandrel strip 144b and the mandrel strip and horizontally between the mandrel islands 142a and 144a is free from mandrel materials, and thus the region R23 can be referred to as a mandrel-free region R23. Because the mandrel-free region R23 inherits the pattern of the photoresist-free region R13 (as shown in FIG. 2A), the mandrel-free region R23 has substantially the same size as the photoresist-free region R13.

The mandrel island 144a has a length L222 in X-direction, and the mandrel strip 146 has a length L232 in X-direction. A summation of the length L222 of the mandrel island 144a and the length L224 of the mandrel strip 144b is less than the length L232 of the mandrel strip 146. In this manner, a region R21 vertically between the mandrel strip 146 and the mandrel strip 144c is free from mandrel materials, and thus the region R21 can be referred to as a mandrel-free region R21. Because the mandrel-free region R21 inherits the pattern of the photoresist-free region R11 (as shown in FIG. 2A), the mandrel-free region R21 has substantially the same size as the photoresist-free region R11.

The mandrel island 142a has a width W212 in Y-direction, the mandrel strips 142b and 142c respectively have widths W214 and W216 in Y-direction, the mandrel strips 146 and 148 respectively have widths W232 and W242 in Y-direction. Any neighboring two of the mandrel strips 142b, 144b, 146 and 148 are separated by a spacing S2. In some embodiments, the width W212 of the mandrel island 142a is greater than the widths W214 and W216 of the mandrel strip 142b and 142c, widths W232 and W242 of the mandrel strips 146 and 148, and the spacing S2. For example, in the depicted embodiments, the width W212 of the mandrel island 142a is greater than a number of (W214+3×W242+ 4×S1), so as to form the mandrel-free region R23 with a width in Y-direction greater than the number of a number of (W214+3×W242+4×S1). Similarly, the mandrel island 144a has a width W222 in Y-direction, and the width W222 is greater than a number of (W114+3×W142+4×S1), so as to form the photoresist-free region R21 with a suitable size. In some embodiments, the width W212 of the mandrel island 142a is in a range from about 200 nm to about 1000 nm, the width W214 of the mandrel strip 142b is in a range from about 10 nm to about 50 nm, the width W216 of the mandrel strip 142c is in a range from about 10 nm to about 50 nm, the width W232 of the mandrel strip 146 is in a range from about 10 nm to about 50 nm, the width W242 of the mandrel strip 148 is in a range from about 10 nm to about 50 nm, the width W222 of the mandrel island 144a is in a range from about 200 nm to about 1000 nm, and the spacing S2 is in a range from about 30 nm to about 50 nm. In some embodiments, the widths W214, W216, W232 and W242 of the mandrel strips 142b, 142c, 146 and 148 are substantially the same. In some embodiments, the width W212 of the mandrel island 142a is substantially the same as the width et W222 of the mandrel island 184a.

In some embodiments, a distance between the mandrel strips 142b and 144b is different from a distance between the mandrel strips 142c and 144b. In greater detail, the distance between the mandrel strips 142b and 144b is less than the distance between the mandrel strips 142c and 144b. Similarly, a distance between the mandrel strips 144b and 146 is different from a distance between the mandrel strips 144c and 146. In greater detail, the distance between the mandrel strips 144b and 146 is less than the distance between the mandrel strips 144c and 146.

In some embodiments, the mandrels 142-148 have rounded (or curvy) corners and rounded ends substantially the same as the rounded corners and rounded ends of the photoresist patterns 182-188 in the photoresist layer 180 (See FIGS. 2A and 2B). For example, the first mandrel 142 includes a rounded corner C211 connecting an X-directional sidewall SW21 and a Y-directional sidewall SW22 of the mandrel island 142a, a rounded corner C212 connecting another Y-direction sidewall SW23 of the mandrel island 142a and an X-directional sidewall SW24 of the mandrel strip 142b, a rounded corner C213 connecting the Y-directional sidewall SW22 of the mandrel island 142a and an X-directional sidewall SW25 of the mandrel strip 142c, and a rounded corner C214 connecting the Y-direction sidewall SW23 and another X-direction sidewall SW26 of the mandrel island 142a. The second mandrel 144 includes rounded corners C221, C222, C223 and C224 similar to the respective rounded corners C211-C214, and thus description about the rounded corners C221-C224 is not repeated herein for the sake of brevity.

Moreover, the mandrel strip 142b has a rounded end C215 away from the mandrel island 142a, and the mandrel strip 142c also has a rounded end (not illustrated) away from the mandrel island 142a. The mandrel strip 144b has a rounded end C225 away from the mandrel island 144a, and the mandrel strip 144c also has a rounded end (not illustrated) away from the mandrel island 144a. The mandrel strips 146 and 148 have rounded ends C235 and C245, respectively.

Figure 4A:
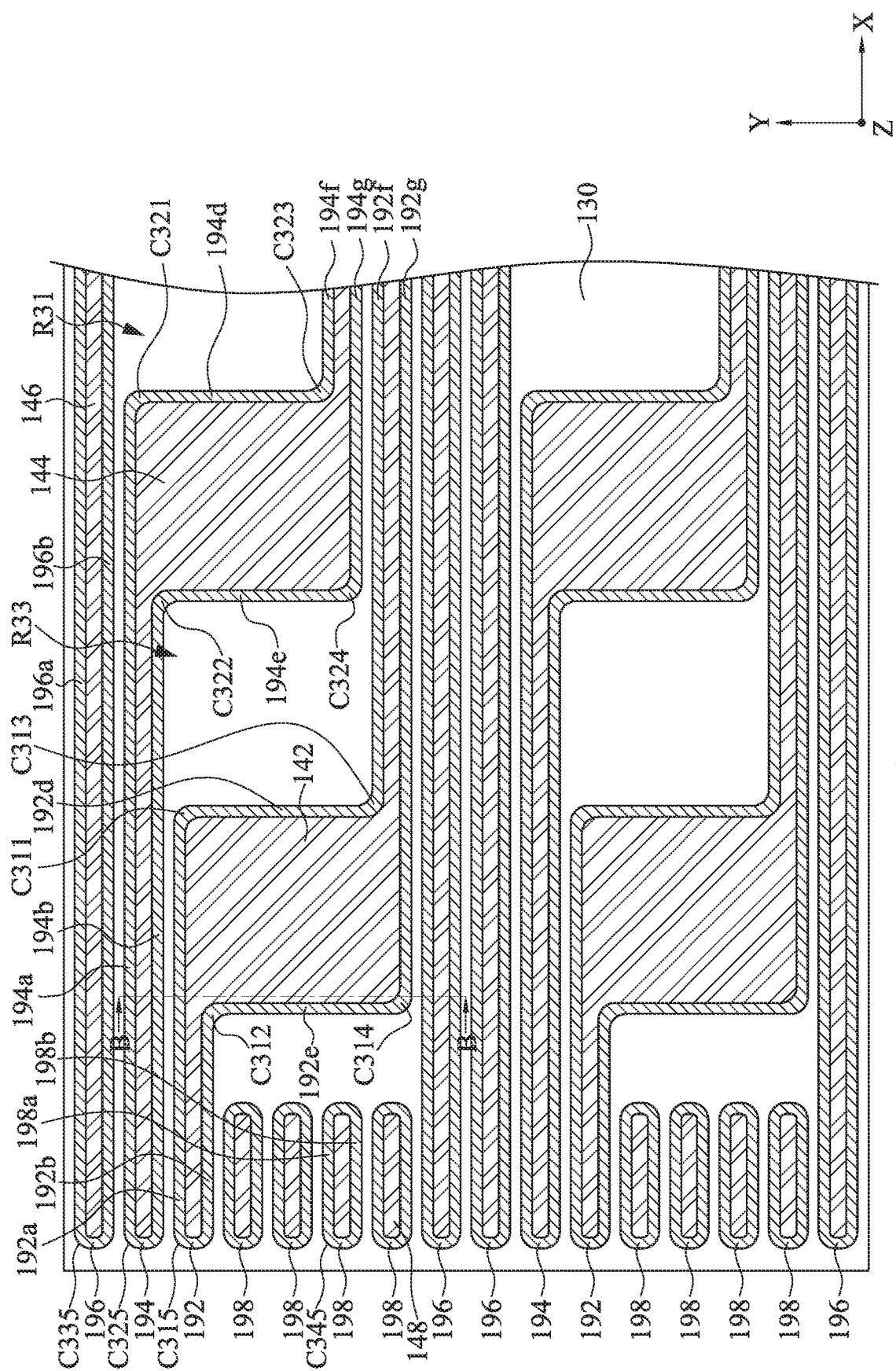
Figure 4B:
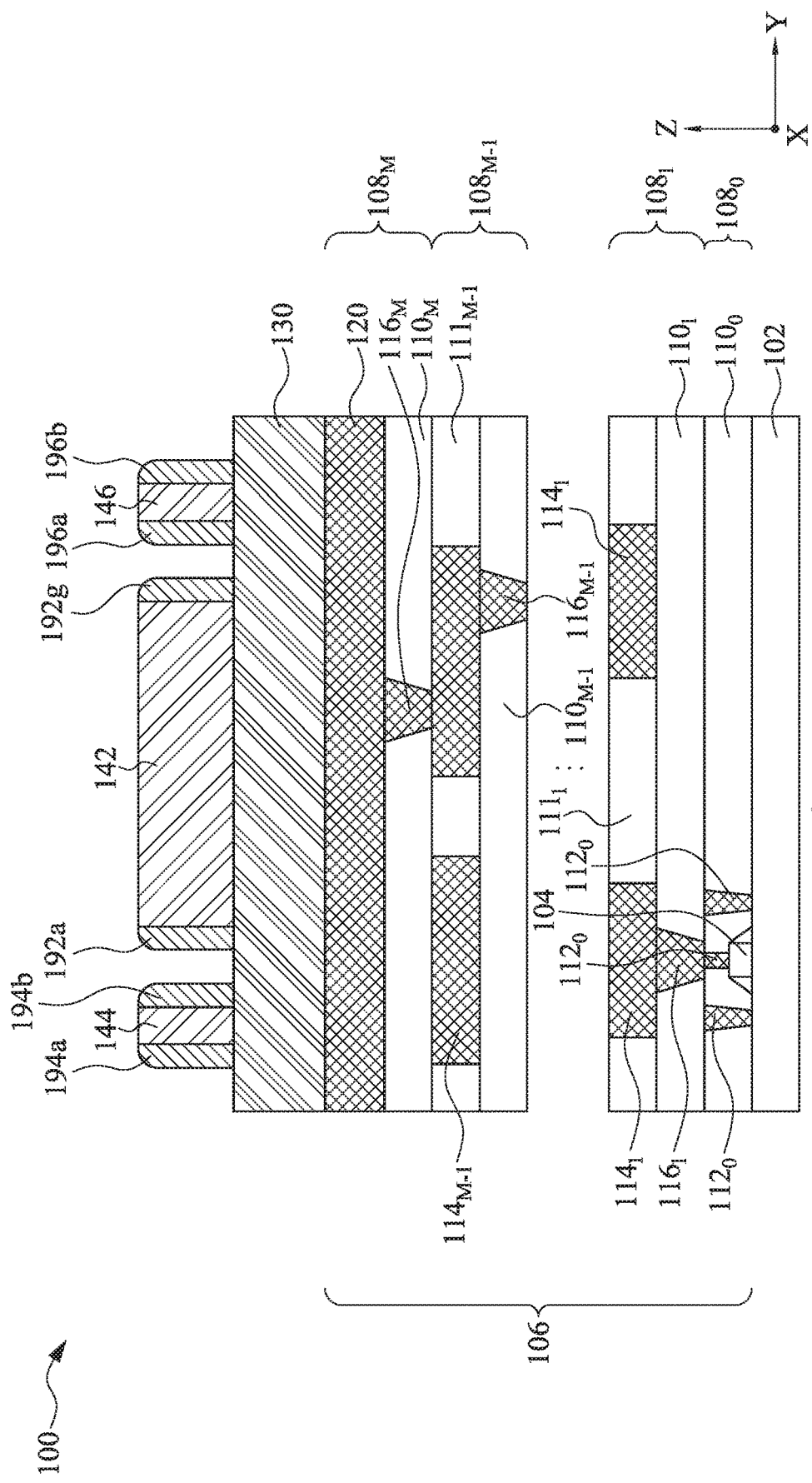

Returning to FIG. 1, the method M1 then proceeds to block S13 where spacers are formed around the respective mandrels. Referring to FIGS. 4A and 4B, in some embodiments of block S13, first ring-shaped spacers 192 are formed around the respective first mandrels 142, second ring-shaped spacers 194 are formed around the respective second mandrels 144, third ring-shaped spacers 196 are formed around the respective third mandrels 146, and fourth ring-shaped spacers 198 are formed around the respective fourth mandrels 148. The spacers 192-198 may comprise an oxide (such a silicon oxide, aluminum oxide, titanium oxide, or the like), a nitride (such as SiN, titanium nitride, or the like), an oxynitride (such as SiON, or the like), an oxycarbide (such as SiOC, or the like), a carbonitride (such as SiCN, or the like), the like, or a combination thereof.

Formation of these spacers 192-198 includes, for example, conformally depositing a spacer layer over the mandrels 142, 144, 146 and 148, and performing an anisotropic dry etch process to remove horizontal portions of the spacer layer from top surfaces of the mandrels 142, 144, 146, 148 and the hard mask layer 130. Portions of the spacer layer remaining on the sidewalls of the mandrels 142, 144, 146 and 148 form the spacers 192, 194, 196 and 198. In some embodiments, the spacer layer is patterned by a dry etch process with etch process gases including $O_2$, $C_xH_yF_z$, $N_2$, $H_2$, HBr, $Cl_2$, He, the like, or a combination thereof.

The first ring-shaped spacer 192 is conformal to the sidewall of the first mandrel 142, as illustrated in FIG. 4A. In greater detail, the first ring-shaped spacer 192 includes two first spacer strips 192a and 192b extending in X-direction and a rounded end (or curvy end) C315 connecting the first spacer strips 192a and 192b. The first spacer strip 192a has a length greater than a length of the spacer strip 192b in X-direction. The first ring-shaped spacer 192 further includes two second spacer strips 192d and 192e extending in Y-direction, a rounded corner (or curvy corner) C311 connecting the first and second spacer strips 192a and 192d that are perpendicular to each other, and a rounded corner (or curvy corner) C312 connecting the first and second spacer strips 192b and 192e that are perpendicular to each other. The second spacer strip 192e has a length greater than a length of the second spacer strip 192d in Y-direction. The first ring-shaped spacer 192 further includes two third spacer strips 192f and 192g extending in X-direction, a rounded corner (or curvy corner) C313 substantially diagonal to the rounded corner C312 and connecting the second and third spacer strips 192d and 192f that are perpendicular to each other, and a rounded corner (or curvy corner) C314 substantially diagonal to the rounded corner C311 and connecting the second and third spacer strips 192e and 192g that are perpendicular to each other. Comparing to a previous approach where mandrels are formed to have uniform straight strip shapes (e.g. third and fourth mandrels 146 and 148), some mandrels in current approach has a "Z" shape (e.g. first and second mandrels 142, 144) where two relative narrower strip mandrels could be connected by a relative wider island mandrel. Thus, the spacers formed alongside sidewalls of the "Z" shaped mandrels can have a "Z" shape where two lateral straight strips (e.g. 192b and 192g) could be connected by a vertical straight strips (e.g. 192e).

Similarly, the second ring-shaped spacer 194 is conformal to the sidewall of the first mandrel 144. In greater detail, the first ring-shaped spacer 194 includes two first spacer strips 194a and 194b extending in X-direction and a rounded end (or curvy end) C325 connecting the first spacer strips 194a and 194b. The first spacer strip 194a has a length greater than a length of the spacer strip 194b in X-direction. The second ring-shaped spacer 194 further includes two second spacer strips 194d and 194e extending in Y-direction, a rounded corner (or curvy corner) C321 connecting the first and second spacer strips 194a and 194d that are perpendicular to each other, and a rounded corner (or curvy corner) C322 connecting the first and second spacer strips 194b and 194e that are perpendicular to each other. The second spacer strip 194e has a length greater than a length of the second spacer strip 194d in Y-direction. The second ring-shaped spacer 194 further includes two third spacer strips 194f and 194g extending in X-direction, a rounded corner (or curvy corner) C323 substantially diagonal to the rounded corner C322 and connecting the second and third spacer strips 194d and 194f that are perpendicular to each other, and a rounded corner (or curvy corner) C324 substantially diagonal to the rounded corner C321 and connecting the second and third spacer strips 194e and 194g that are perpendicular to each other.

The third ring-shaped spacer 196 is conformal to the sidewall of the third mandrel 146, as illustrated in FIG. 4A. In greater detail, the third ring-shaped spacer 196 includes two long spacer strips 196a and 196b extending in X-direction and rounded ends (or curvy end) C335 connecting the spacer strips 196a and 196b. Similarly, the fourth ring-shaped spacer 198 is conformal to the sidewall of the fourth mandrel 148 and includes two short spacer strips 198a and 198*b* extending in X-direction and rounded ends (or curvy end) C345 connecting the short spacer strips 198*a* and 198*b*. The short spacer strips 198*a* and 198*b* are shorter than the long spacer strips 196*a* and 196*b* because the short mandrels 148 are shorter than the long mandrels 146.

The X-directional spacer strip 194*b* of the second ring-shaped spacer 194 is longer than the X-directional spacer strip 192*a* of the first ring-shaped spacer 192 in X-direction, so that the Y-directional spacer strip 192*d* of the first ring-shaped spacer 192 can be separated from the Y-directional spacer strip 194*e* of the second ring-shaped spacer 194. As a result, a region R33 between the X-directional spacer strips 194*b* and 192*f* and between the Y-directional spacer strips 192*d* and 194*e* is free from other spacers, and thus the region R33 can be referred to as a spacer-free region R33. Similarly, a region R31 between the long spacer strip 196*b* and the X-directional spacer strip 194*f* is free from other spacers, and thus the region R31 can be referred to as a spacer-free region R31.

Figure 5A:
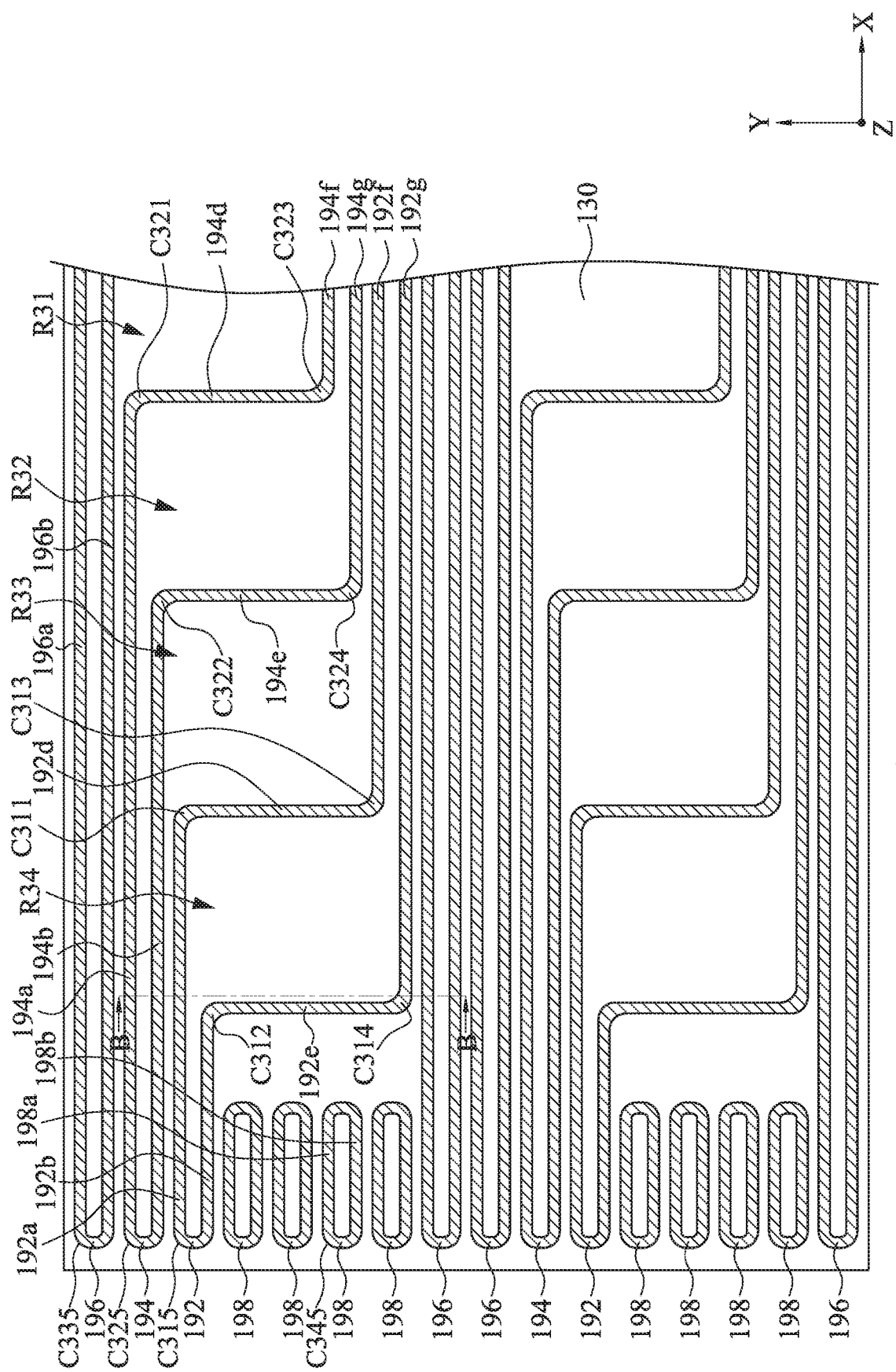
Figure 5B:
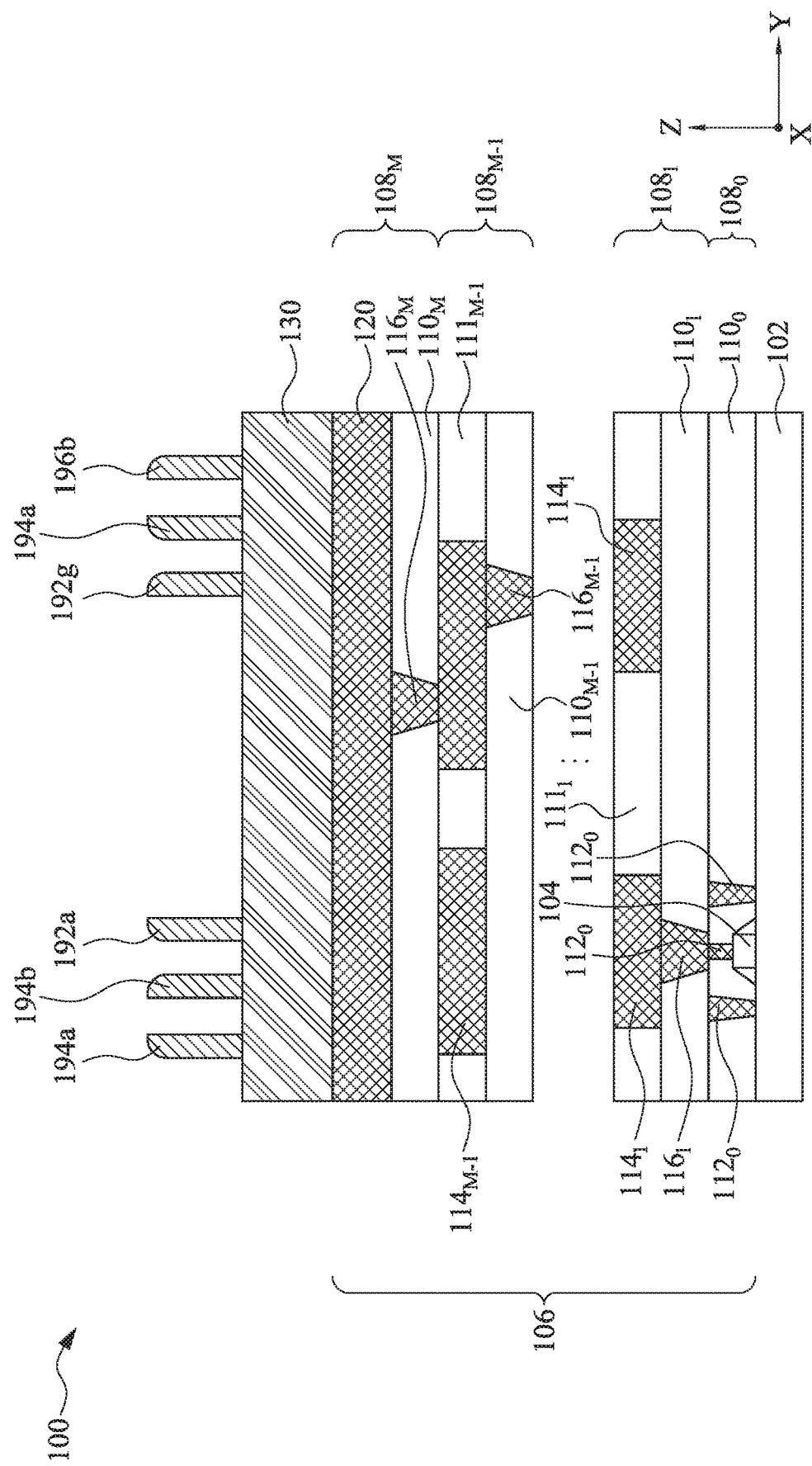

Returning to FIG. 1, the method M1 then proceeds to block S14 where the mandrels are removed. In some embodiments of block S14, mandrels 142, 144, 146 and 148 are removed by, for example, a plasma etch process, although other suitable etching process may also be used. The resulting structure is shown in FIGS. 5A and 5B. In some embodiments, the plasma etching process has a high etch selectivity for the mandrel material, so that mandrels 142-148 can be removed while the ring-shaped spacers 192-198 and the hard mask layer 130 remain substantially intact. Example etchants for selectively etching the mandrel includes $O_2$, $CO_2$, $C_xH_yF_z$, Ar, $N_2$, $H_2$, the like, or a combination thereof.

As illustrated in FIG. 5A, a region R32 between the X-directional spacer strips 194*a* and 194*g* and between the Y-directional spacer strips 194*d* and 194*d* is free from other spacers, and thus the region R32 can be referred to as a spacer-free region R32. Similarly, a region R34 between the X-directional spacer strips 192*a* and 192*g* and between the Y-directional spacer strips 192*d* and 192*e* is free from other spacers, and thus the region R34 can be referred to as a spacer-free region R34.

The spacer-free region R32 has a width in Y-direction substantially the same as the width W222 of the rectangular mandrel portion 144*a* (See FIG. 3A), and a length in X-direction substantially the same as the width L222 of the rectangular mandrel portion 144*a*. Similarly, the region R34 has a width in Y-direction substantially the same as the width W212 of the rectangular mandrel portion 142*a* (See FIG. 3A), and a length in X-direction substantially the same as the width L212 of the rectangular mandrel portion 142*a*.

Figure 6A:
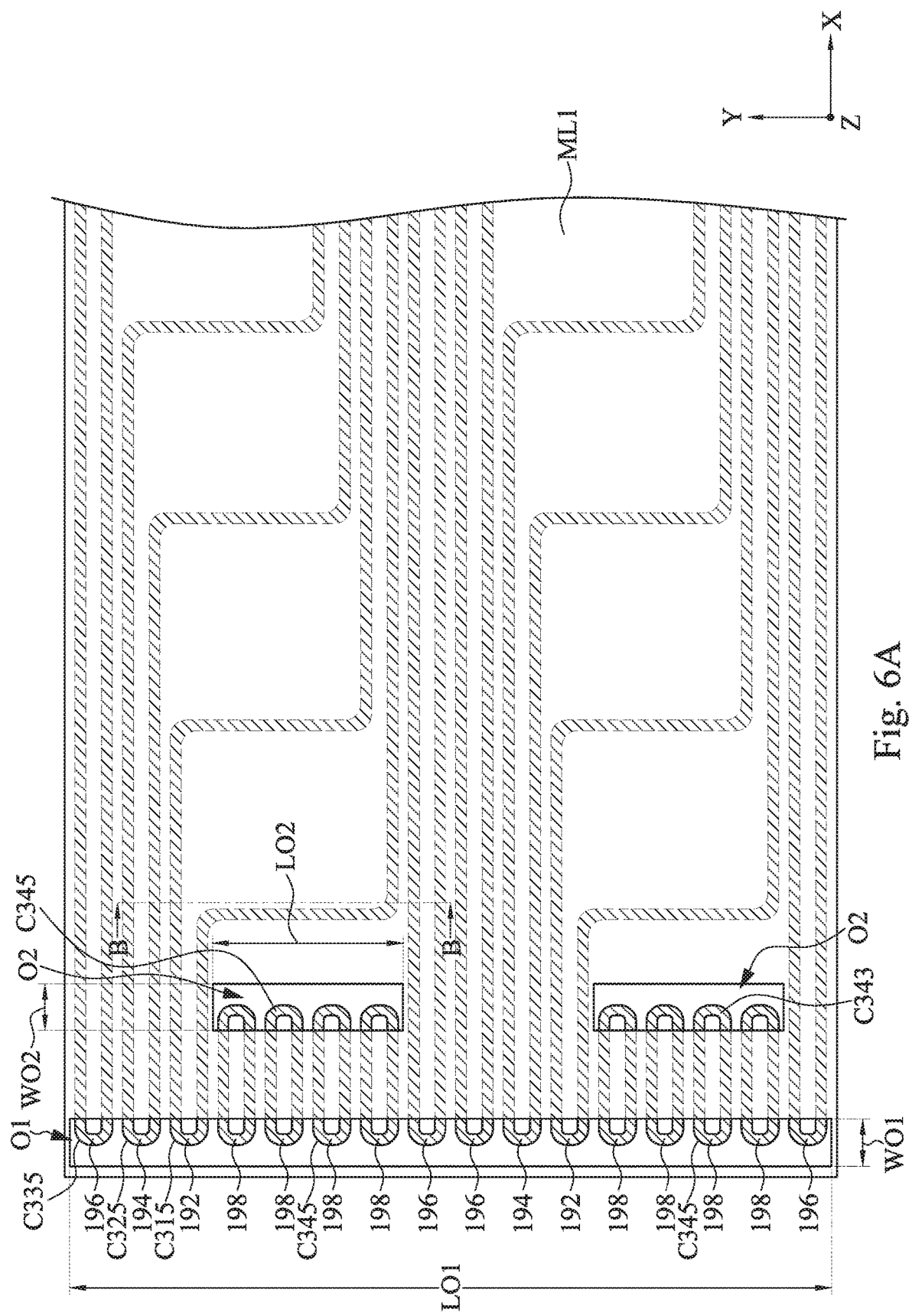
Figure 6B:
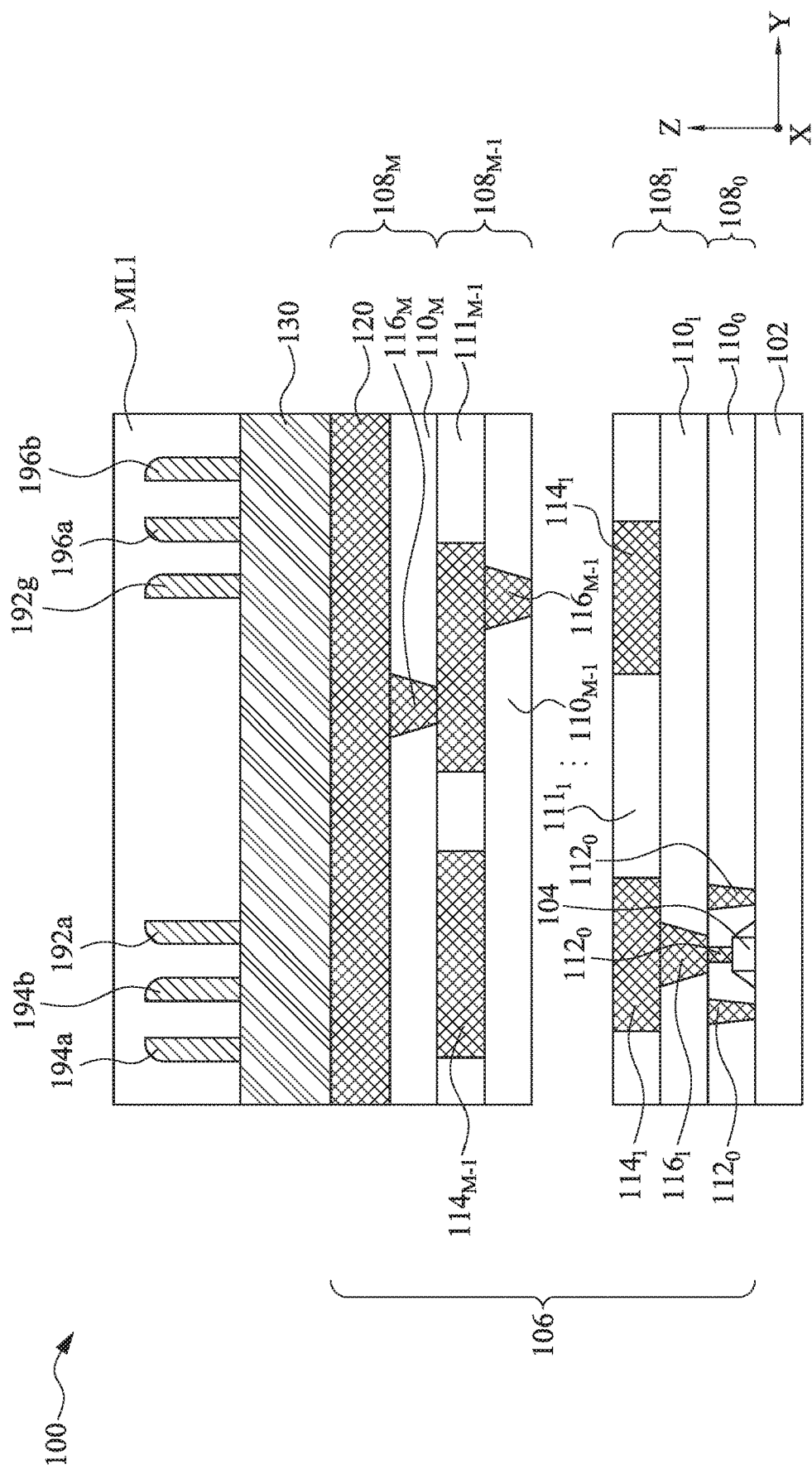

Returning to FIG. 1, the method M1 then proceeds to block S15 where a patterned mask is formed over the portions of the spacers to expose ends of the spacers. Referring to FIGS. 6A and 6B, in some embodiments of block S15, a mask layer ML1 (e.g., a photoresist) is formed over the ring-shaped spacers 192, 194, 196 and 198. The mask layer ML1 is then patterned (e.g., using a photolithography process) to form openings O1 and O2 to expose ends of the ring-shaped spacers 192-198. For example, the opening O1 expose rounded ends C315, C325, C335 and C345 of the corresponding ring-shaped spacers 192, 194, 196 and 198, and each of the openings O2 exposes rounded ends C345 of the ring-shaped spacers 198. The openings O2 have lengths less than a length of the O1 in Y-direction, so that spacer strips will not be exposed by the openings O2. The opening O1 has a length LO1 in Y-direction and a width WO1 in X-direction, and the opening O2 has a length LO2 in Y-direction and a width WO2 in X-direction. In some embodiments, the length LO1 of the opening O1 is in a range from about 500 nm to about 1000 nm, the width WO1 of the opening O1 is in a range from about 100 nm to about 200 nm, the length LO2 of the opening O2 is in a range from about 200 nm to about 500 nm, and the width WO2 of the opening O2 is in a range from about 100 nm to about 200 nm, In some embodiments, the width WO1 of the opening O1 is substantially the same as the width WO2 of the opening O2.

Figure 7A:
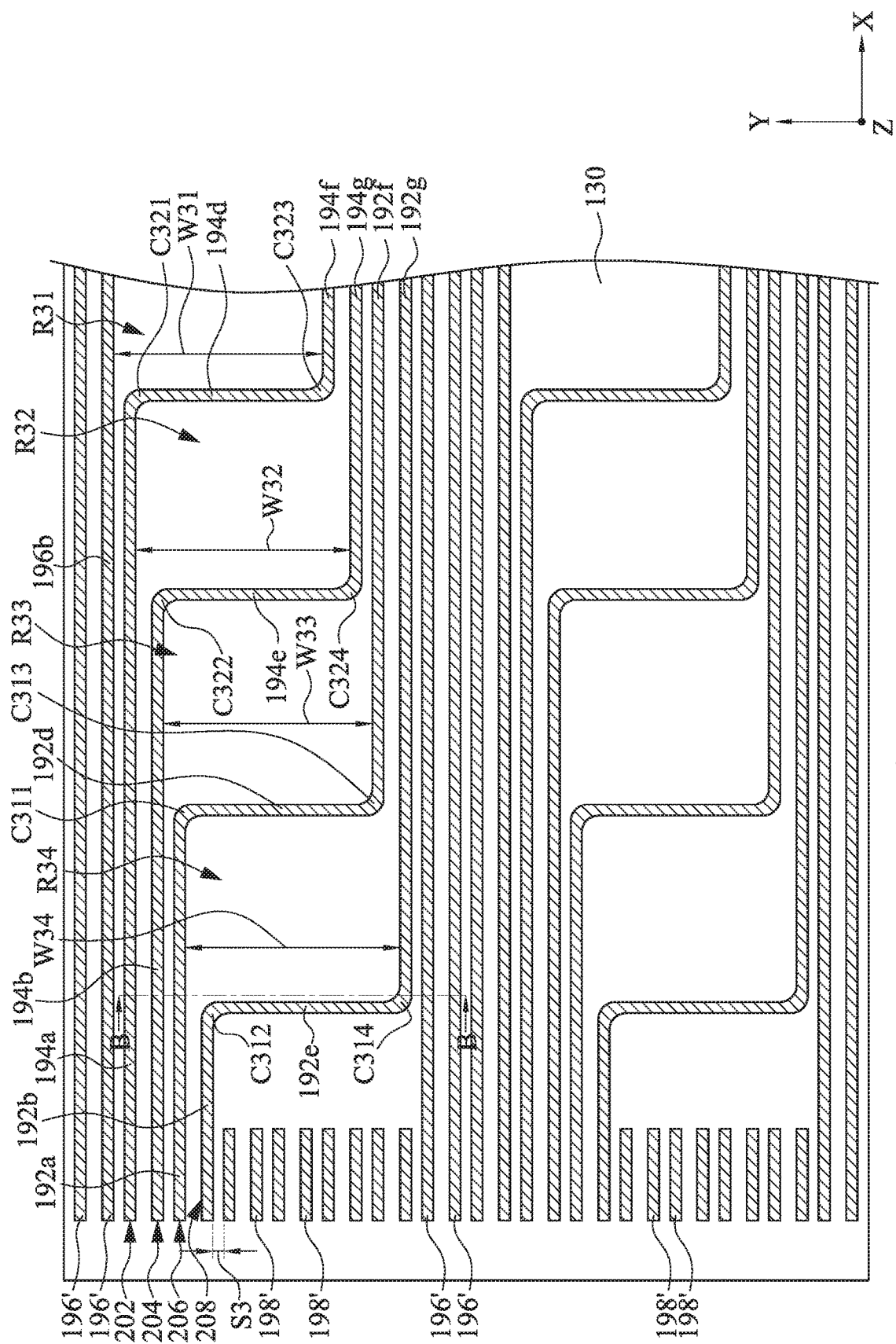
Figure 7B:
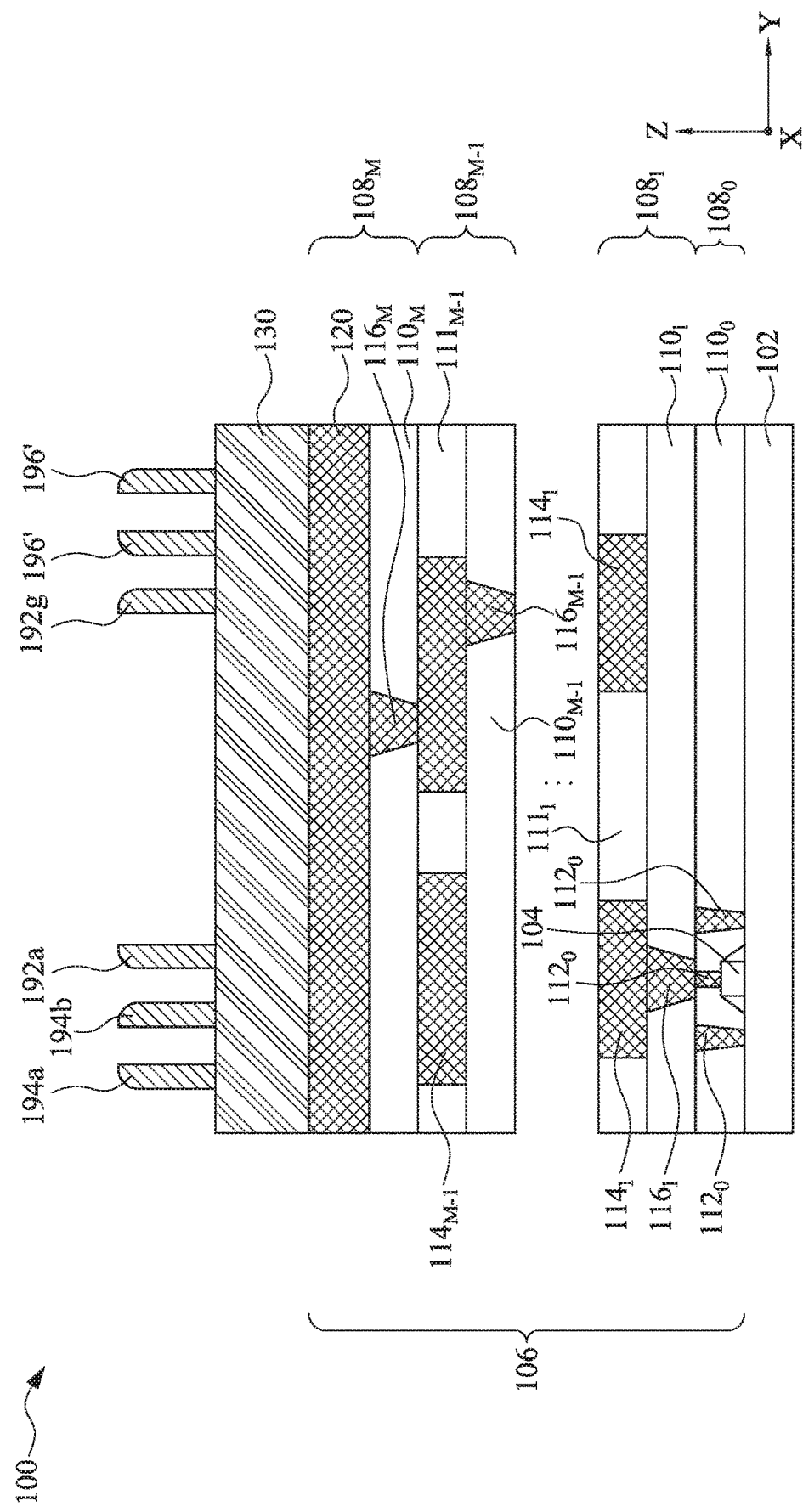

Returning to FIG. 1, the method M1 then proceeds to block S16 where a cut process is performed to the spacers. In some embodiments, the cut process may be an etching process (e.g., dry etching, wet etching or combinations thereof) performed to remove the rounded ends C135, C325, C335 and C345 from the ring-shaped spacers 192, 194, 196 and 198 using the mask layer ML1 as an etching mask. Thereafter, the mask layer ML1 is removed. FIGS. 7A and 7B show a result of the cut process according to some embodiments of the present disclosure.

The long spacer strips 196*a* and 196*b* of the spacers 196 (See FIG. 5A) are separated due to the cut process, and they can be referred to as long spacer strips 196' for the convenience of discussion. The short spacer strips 198*a* and 198*b* of the spacers 198 are separated and referred to as short spacer strips 198' for the convenience of discussion as well.

After the cut process, the X-directional spacer strip 194*a* remains connected to a top end of the Y-directional spacer strip 194*d* by the rounded corner C321, and a bottom end of the Y-directional spacer strip 194*d* remains connected to the X-directional spacer strip 194*f* by the rounded corner C323. In other words, the X-directional spacer strips 194*a* and 194*f* are misaligned and connected by the Y-directional spacer strip 194*d*. The X-directional spacer strips 194*a*, 194*f* and the Y-directional spacer strip 194*d* connected therebetween are in combination referred to as a first spacer 202.

Similarly, after the cut process, the X-directional spacer strip 194*b* remains connected to a top end of the Y-directional spacer strip 194*e* by the rounded corner C322, and a bottom end of the Y-directional spacer strip 194*e* remains connected to the X-directional spacer strip 194*g* by the rounded corner C324. The misaligned X-directional spacer strips 194*b*, 194*g* and the Y-directional spacer strip 194*e* connected therebetween are in combination referred to as a second spacer 204.

Similarly, the misaligned X-directional spacer strips 192*a*, 192*f* and the Y-directional spacer strip 192*d* connected therebetween are in combination referred to as a third spacer 206, and the misaligned X-directional spacer strips 192*b*, 192*g* and the Y-directional spacer strip 192*e* connected therebetween are in combination referred to as a fourth spacer 208.

The first, second, third and fourth spacers 202-208 are arranged in sequence and between two long spacer strips 196'. The region R31 is between the X-directional spacer strip 194*f* of the first spacer 202 and the long spacer strip 196'. The region R32 is between the X-directional spacer strip 194*a* of the first spacer 202 and the X-directional spacer strip 192*g* of the second spacer 204. The region R33 is between the X-directional spacer strip 194*b* of the second spacer 204 and the X-directional spacer strip 192*f* of the third spacer 206. The region R34 is between the X-directional spacer strip 192*a* of the third spacer 206 and the X-directional spacer strip 192*g* of the fourth spacer 208.

As discussed previously, spacers are absent from these regions R31-R34 because of the geometry of the mandrels 142 and 144 as shown in FIG. 3A. Thus, the removal of the spacer structures from the regions R31-R34 is omitted during or after the cut process. Also, the mask layer ML1 does not need to be defined for such a removal. Thereby, the unwanted spacer residues, etching damages, and photolithographic overlay misalignment issue are reduced and improved. In greater detail, the SADP process as described above can result in reduced spacer-to-spacer spacings S3 in Y-direction, which in turn will lead to increased photolithographic challenge and thus a poor overlay and etching process window. Therefore, if spacers are to be removed from, for example, the region R34, photolithographic overlay misalignment of forming a patterned mask used for the removal might result in unwanted attack or even damage to the X-directional spacer strips 192a or 192g, and/or result in unwanted spacer residues in the region R34. The unwanted spacer damage and/or residues might lead to undesired patterns in the target layer 120. However, because removal of the spacers from these regions R31-R34 can be omitted, the unwanted spacer damage and/or residues can be prevented, which in turn will prevent undesired patterns from the target layer 120.

As discussed previously, widths W32 and W34 of the spacer-free regions R32 and R34 are substantially the same as the respective widths W222 and W212 of the rectangular mandrel portions 144a and 142a (See FIG. 3A). As a result, the widths W212 and W222 of the rectangular mandrel portions 144a and 142a can be chosen to be much more than the Y-directional spacer-to-spacer spacing S3 (e.g., more than four times the spacing S3), so as form large spacer-free regions R32 and R34.

Moreover, a width W31 of the spacer-free region R31 is substantially the same as a Y-directional distance from the X-directional spacer strip 196' to the X-directional spacer strip 194f of the first spacer 202, which is in positive correlation with the width W32 of the spacer-free region R32 (i.e., the width W222 of the rectangular mandrel portion 144a). Similarly, a width W33 of the spacer-free region R33 is substantially the same as a Y-directional distance from the X-directional strip 194b to the X-directional spacer strip 192f, which is in positive correlation with the width W34 of the spacer-free region R34 (i.e., the width W212 of the rectangular mandrel portion 142a). As a result, the widths W212 and W222 of the rectangular mandrel portions 144a and 142a can be chosen to be much more than the Y-directional spacer-to-spacer spacing S3 (e.g., more than four times the spacing S3), so as form large spacer-free regions R31 and R33.

Figure 8A:
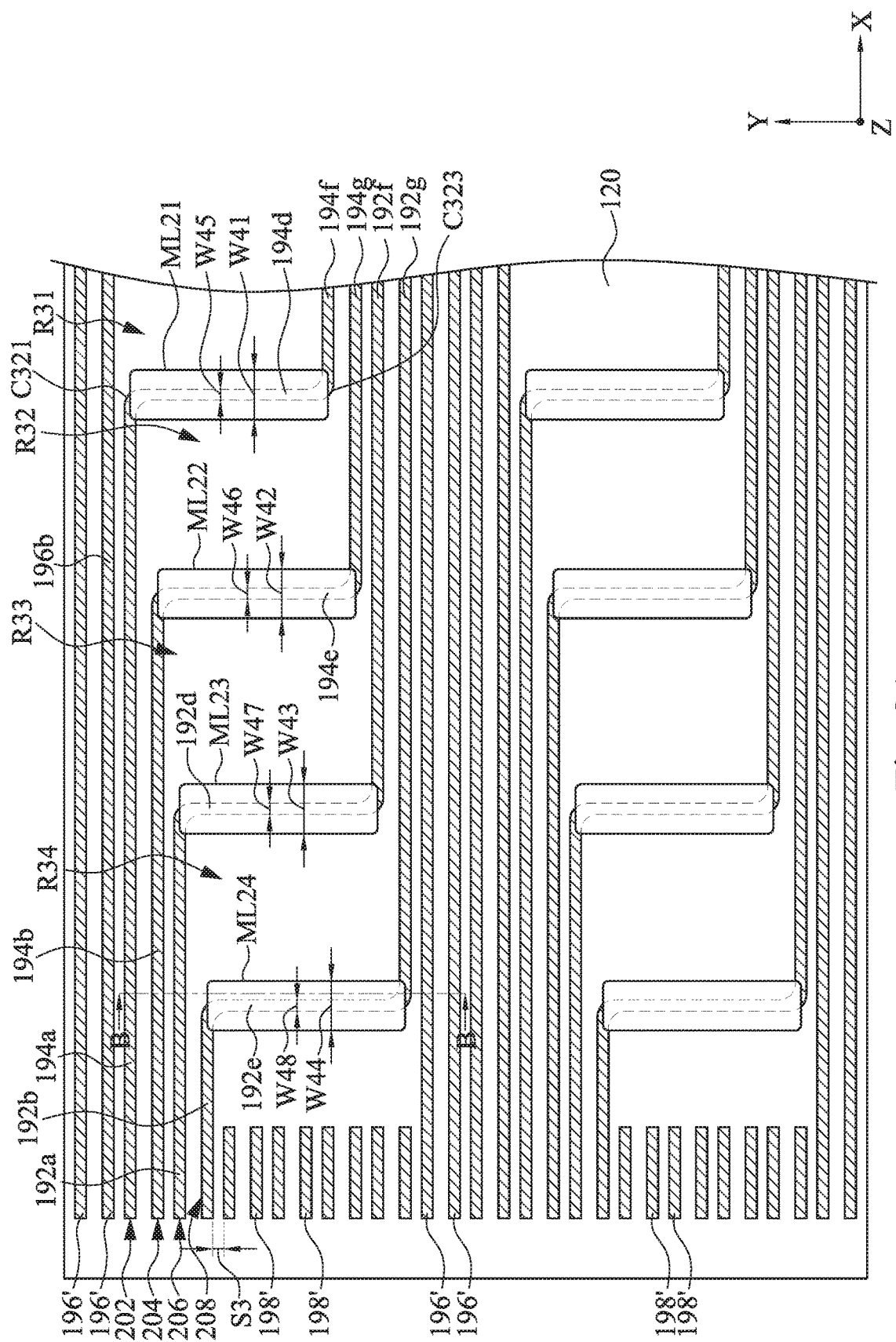
Figure 8B:
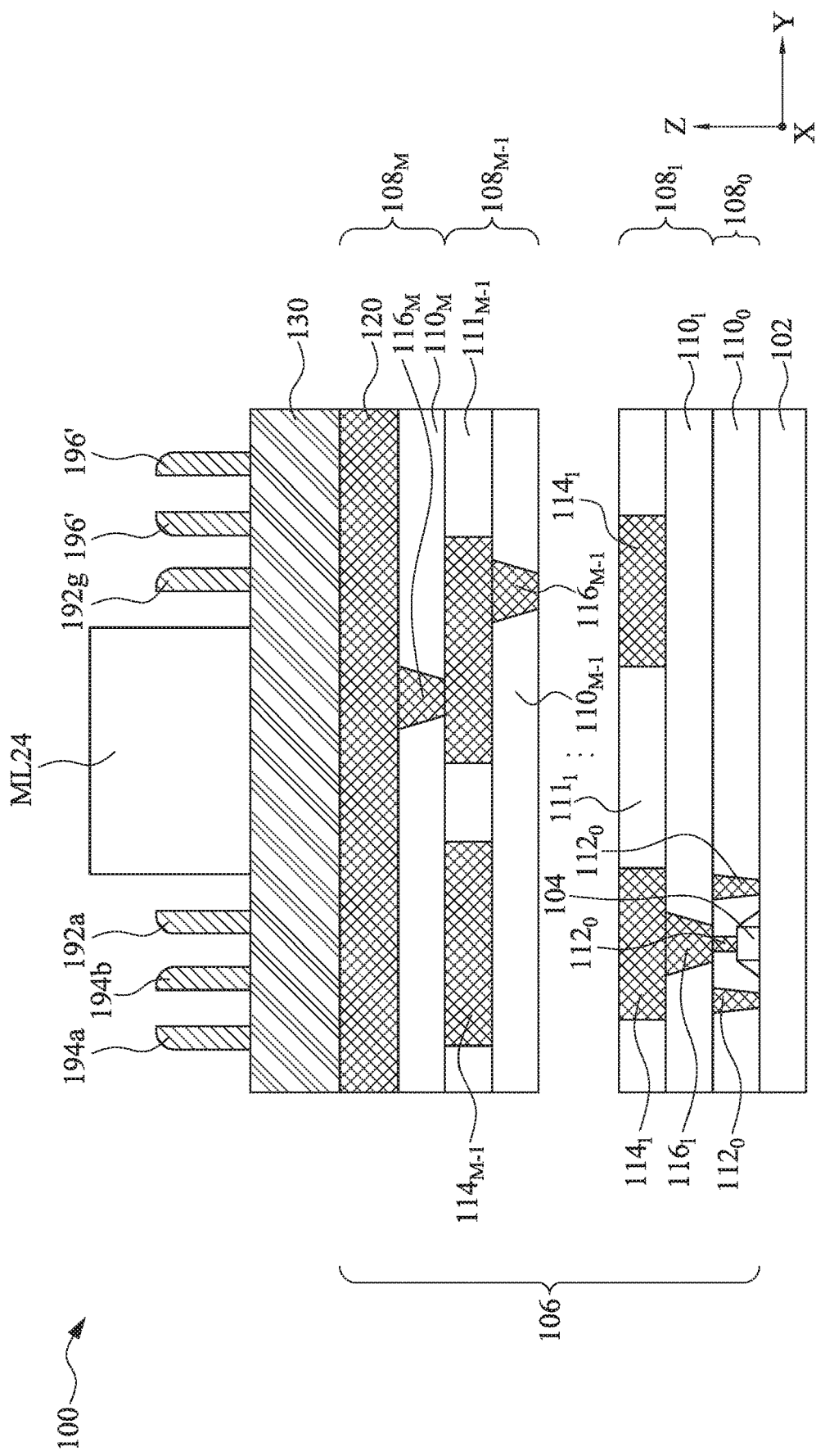

Returning to FIG. 1, the method M1 then proceeds to block S17 where patterned masks are formed respectively over the Y-directional portions of the spacers. In some embodiments of block S17, a mask layer (e.g., a photoresist) is formed over the spacers 196', 198' and 202-208 and then patterned (e.g., using a photolithography process) such that that a plurality of patterned masks ML21, ML22, ML23, and ML24 remain respectively covering the Y-directional spacer strips 194d, 194e, 192d and 192e. The resulting structure is illustrated in FIGS. 8A and 8B. The X-directional spacer strips 192a, 192b, 192f, 192g, 194a, 194b, 194f, 194g, 196' and 196' are free from coverage by the patterned masks ML21-ML24. The patterned masks ML21-24 respectively have widths W41, W42, W43 and W44 in X-direction, and the Y-directional spacer strips 194d, 194e, 192d and 192e respectively have widths W45, W46, W47 and W48 in X-direction. The widths W41-W44 of the patterned masks ML21-ML24 are greater than widths W45-W48 of the Y-directional spacer strips 194d, 194e, 192d and 192e. As a result, when the pattern of the masks ML21-ML24 is transferred to the conductive layer 120, it will result in larger conductive lands compared to conductive lands formed using the pattern of the Y-directional spacer strips 194d, 194e, 192d and 192e. As a result, a via landing window can be expanded. In some embodiments, the widths W45-W48 of the Y-directional spacer strips 194d, 194e, 192d and 192e are in a range from about 10 nm to about 50 nm, and the widths W41-W44 of the patterned masks ML21-ML24 are in a range from about 30 nm to about 150 nm. In greater detail, the width W41 of the patterned mask ML21 is about three times the width W45 of the Y-directional spacer strip 194d covered by the patterned mask ML21, the width W42 of the patterned mask ML22 is about three times the width W46 of the Y-directional spacer strip 194e covered by the patterned mask ML22, the width W43 of the patterned mask ML23 is about three times the width W47 of the Y-directional spacer strip 192d covered by the patterned mask ML23, and the width W44 of the patterned mask ML24 is about three times the width W48 of the Y-directional spacer strip 192e covered by the patterned mask ML24.

Figure 9A:
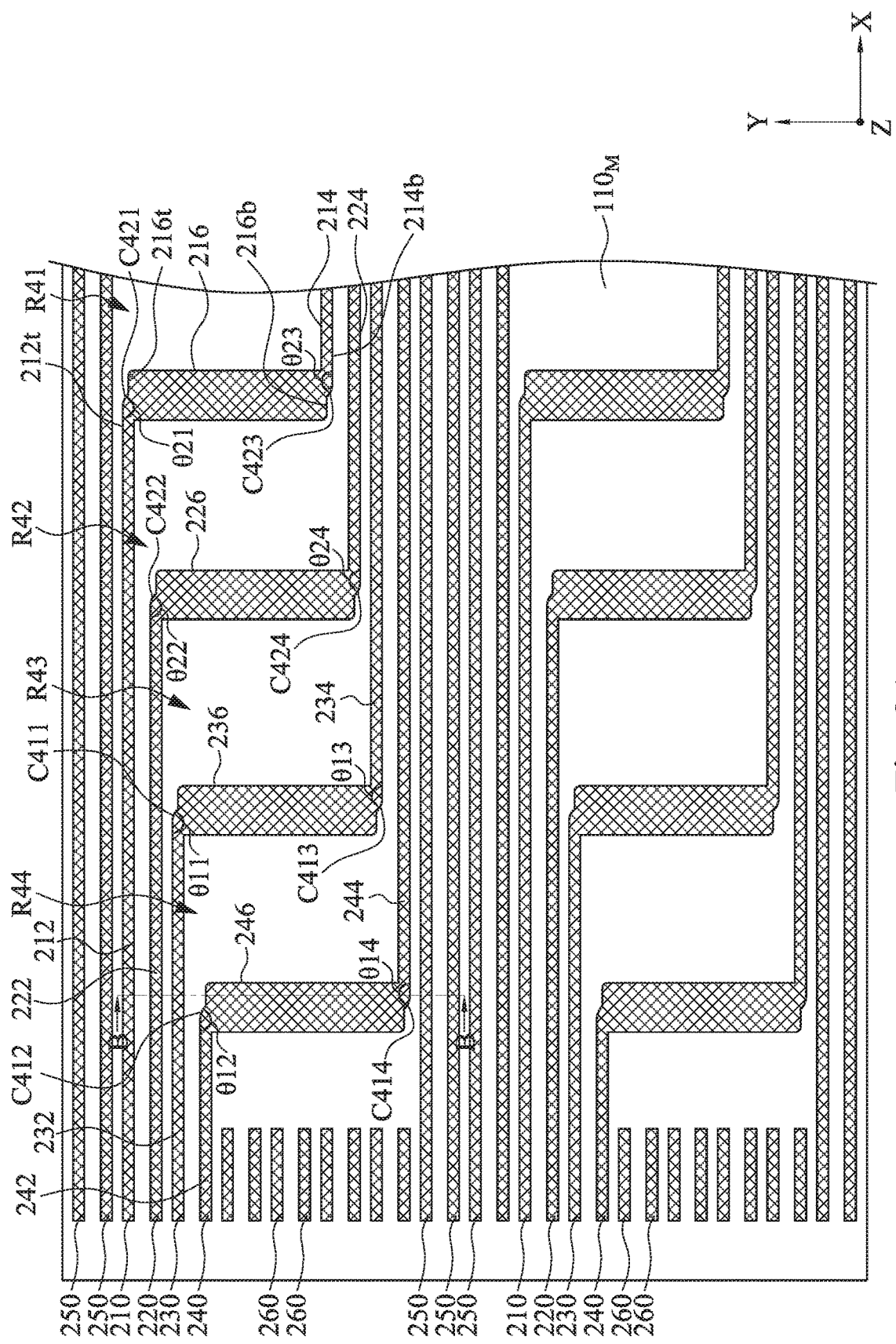
Figure 9B:
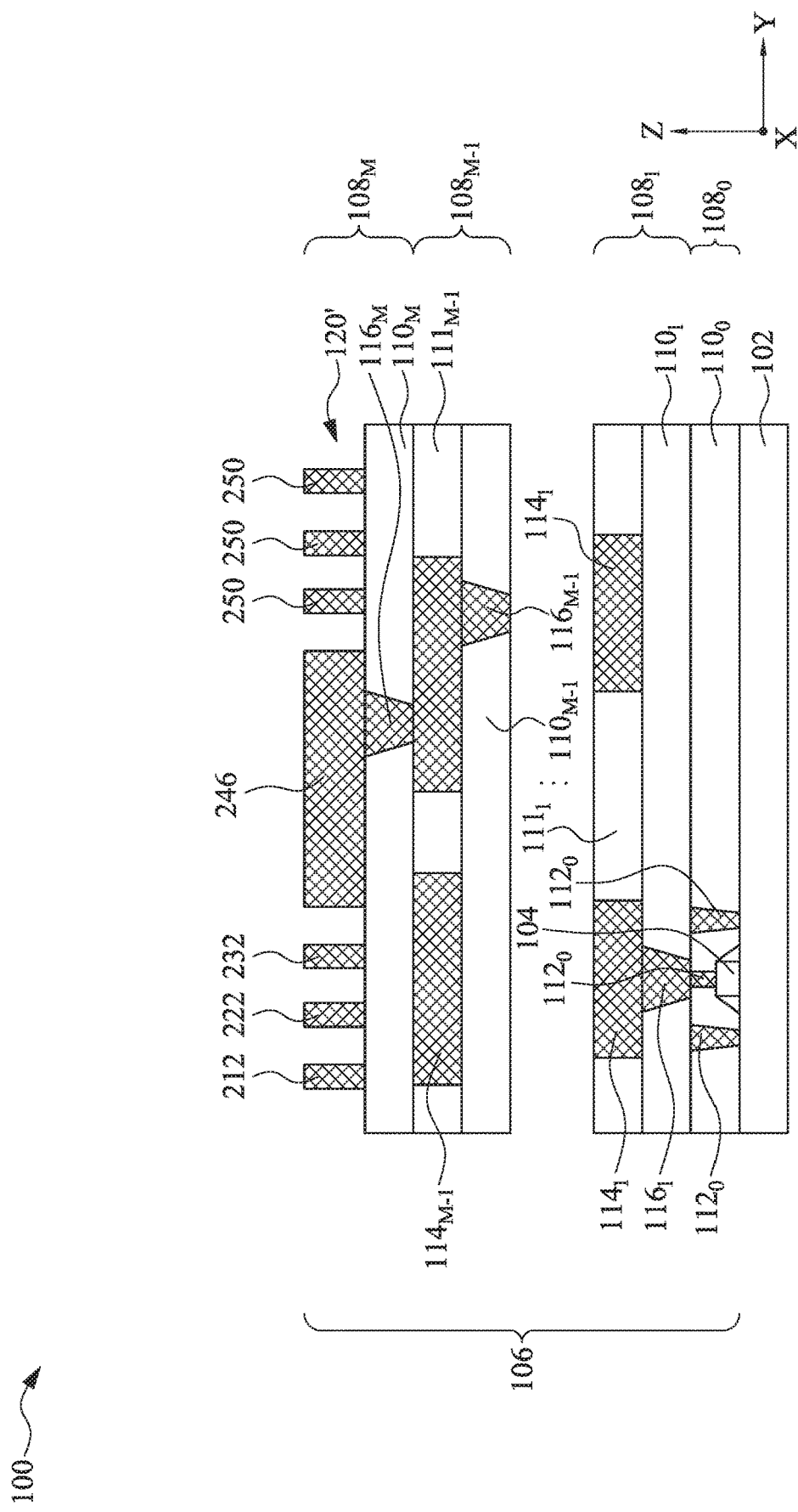

Returning to FIG. 1, the method M1 then proceeds to block S18 where the hard mask layer and the target layer are patterned. Referring to FIGS. 9A and 9B, a patterning process is performed on the hard mask layer 130 and the underlying conductive layer 120 to transfer the pattern of the spacers 196', 198', 202-208 and the patterned masks ML21-ML24 to the hard mask layer 130 and the underlying conductive layer 120. The spacers 196', 198', 202-208, the patterned masks ML21-ML24, and the hard mask layer 130 are then removed using suitable etching techniques. The patterning process results in conductive lines 210, 220, 230, 240, 250 and 260 in the patterned conductive layer 120'. The conductive line 210 has substantially the same shape as a combination of the first spacer 202 and the patterned mask ML21 (See FIG. 8A), the conductive line 220 has substantially the same shape and size as a combination of the first spacer 204 and the patterned mask ML22, the conductive line 230 has substantially the same shape and size as a combination of the first spacer 206 and the patterned mask ML23, and the conductive line 240 has substantially the same shape and size as a combination of the first spacer 208 and the patterned mask ML24. The conductive lines 250 and 260 have substantially the same shape and size as the respective spacer strips 196' and 198'.

The patterning process include one or more suitable etching processes, such as wet etching processes, anisotropic dry etching processes, or combinations thereof. In some embodiments where the hard mask layer 130 includes an ARC, a metal hard mask layer and a dielectric hard mask layer stacked in sequence, the dielectric hard mask layer is patterned by a dry etch process with etch process gases including $O_2$, $CO_2$, $C_xH_yF_z$, Ar, $N_2$, $H_2$, HBr, $Cl_2$, He, the like, or a combination thereof, the metal hard mask layer is patterned using, for example, a dry etch processes with etch process gases including $Cl_2$, $O_2$, $C_xH_yF_z$, $N_2$, $H_2$, the like, or a combination thereof, and the ARC may be patterned by an etch process including etchants such as $C_4F_8$, $N_2$, $O_2$, Ar, the like, or a combination thereof. In some embodiments where the conductive layer 120 includes metal (e.g., copper, aluminum, titanium, or tungsten), the conductive layer 120 is patterned by a dry etch process with etch process gas mixture including $N_2$, $BCl_3$, $Cl_2$, and the like.

Transferring the pattern of the combination of the first spacer 202 and the ML21 to the conductive layer 120 results in the conductive line 210 including misaligned first and second strip portions 212 and 214 extending in X-direction and a via landing portion 216 connected between the first and second strip portions 212 and 214. The strip portions 212, 214 and the via landing portion 216 have substantially the same patterns as the respective spacer strips 194a, 194f and the patterned mask ML21 (See FIG. 8A).

Similarly, transferring the pattern of the combination of the first spacer 204 and the ML22 to the conductive layer 120 results in the conductive line 220 including misaligned X-directional strip portions 222, 224 and a via landing portion 226 connected therebetween. The strip portions 222, 224 and the via landing portion 226 have substantially the same patterns as the respective spacer strips 194b, 194g and the patterned mask ML22 (See FIG. 8A).

Similarly, transferring the pattern of the combination of the first spacer 206 and the ML23 to the conductive layer 120 results in the conductive line 230 including misaligned X-directional strip portions 232, 234 and a via landing portion 236 connected therebetween. The strip portions 232, 234 and the via landing portion 236 have substantially the same patterns as the respective spacer strips 192a, 192f and the patterned mask ML23 (See FIG. 8A).

Similarly, transferring the pattern of the combination of the first spacer 208 and the ML24 to the conductive layer 120 results in the conductive line 240 including misaligned X-directional strip portions 242, 244 and a via landing portion 246 connected therebetween. The strip portions 242, 244 and the via landing portion 246 have substantially the same patterns as the respective spacer strips 192b, 192g and the patterned mask ML24 (See FIG. 8A).

The conductive line 210 includes a rounded corner C421 connecting a top sidewall 212t of the X-directional strip portion 212 and a top sidewall 216t of the via landing portion 216, and the rounded corner C421 has a shape and size substantially the same as that of the rounded corner C321 of the first spacer 201 (See FIG. 8A). Moreover, the conductive line 210 includes a rounded corner C423 connecting a bottom sidewall 214b of the X-directional strip portion 214 and a bottom sidewall 216b of the via landing portion 216, and the rounded corner C423 has a shape and size substantially the same as that of the rounded corner C323 of the first spacer 202 (See FIG. 8A). Similarly, the conductive line 220 includes a rounded corner C422 connecting the X-directional strip portion 222 and the via landing portion 226, and a rounded corner C424 connecting the via landing portion 226 and the X-directional strip portion 224. Similarly, the conductive line 230 includes a rounded corner C411 connecting the X-directional strip portion 232 and the via landing portion 236, and a rounded corner C413 connecting the via landing portion 236 and the X-directional strip portion 234. Similarly, the conductive line 240 includes a rounded corner C412 connecting the X-directional strip portion 242 and the via landing portion 246, and a rounded corner C414 connecting the via landing portion 246 and the X-directional strip portion 244.

These rounded corners C411-C414 and C421-C424 have corner angles greater than 90 degrees as illustrated in FIG. 9A because of the pattern of combination of the corresponding patterned mask and the spacer as illustrated in FIG. 8A. For example, the rounded corner C421 of the conductive line 210 has a corner angle $\theta 21$ in a range from about 100 degrees to about 170 degrees, the rounded corner C423 of the conductive line 210 has a corner angle $\theta 23$ in a range from about 100 degrees to about 170 degrees, rounded corner C422 of the conductive line 220 has a corner angle $\theta 22$ in a range from about 100 degrees to about 170 degrees, the rounded corner C424 of the conductive line 220 has a corner angle $\theta 24$ in a range from about 100 degrees to about 170 degrees, the rounded corner C411 of the conductive line 230 has a corner angle $\theta 11$ in a range from about 100 degrees to about 170 degrees, the rounded corner C413 of the conductive line 230 has a corner angle $\theta 13$ in a range from about 100 degrees to about 170 degrees, the rounded corner C412 of the conductive line 240 has a corner angle $\theta 12$ in a range from about 100 degrees to about 170 degrees, and the rounded corner C414 of the conductive line 240 has a corner angle $\theta 14$ in a range from about 100 degrees to about 170 degrees. The obtuse corner angles will result in improved robustness of connection between a thin conductive line (e.g., conductive line 212) and a rectangular conductive structure (e.g., via landing portion 216). Comparing to a previous approach where a patterned mask (e.g. ML24) is formed between two separate lateral spacer strips (e.g. 192b and 192g), in the current approach, the patterned mask (e.g. ML24) is formed covering a vertical spacer strip (e.g. 192e). Thus, even with some misalignment that results the patterned mask (e.g. ML24) shift from the separate lateral spacer strips (e.g. 192b or 192g), the via landing portion (e.g. 246) of the conductive line 240 would not be disconnected from the X-directional strip portions (e.g. 242 or 244) because of the existence of the vertical spacer strip (e.g. 192e) for patterning. Thereby, the liability connecting reliability is improved.

A region R41 is between the conductive line 210 and the strip portion 214 of the conductive line 220. A region R42 is between the strip portion 212 of the conductive line 210 and the strip portion 224 of the conductive line 220. A region R33 is between the strip portion 222 of the conductive line 220 and the strip portion 234 of the conductive line 230. A region R34 is between the strip portion 232 of the conductive line 230 and the strip portion 244 of the conductive line 240. These regions R41-R44 correspond to the respective spacer-free regions R31-R34 as shown in FIG. 8A. Therefore, unwanted pattern in these regions is prevented because the unwanted spacer damage and/or residues can be reduced, as discussed previously.

Figure 10A:
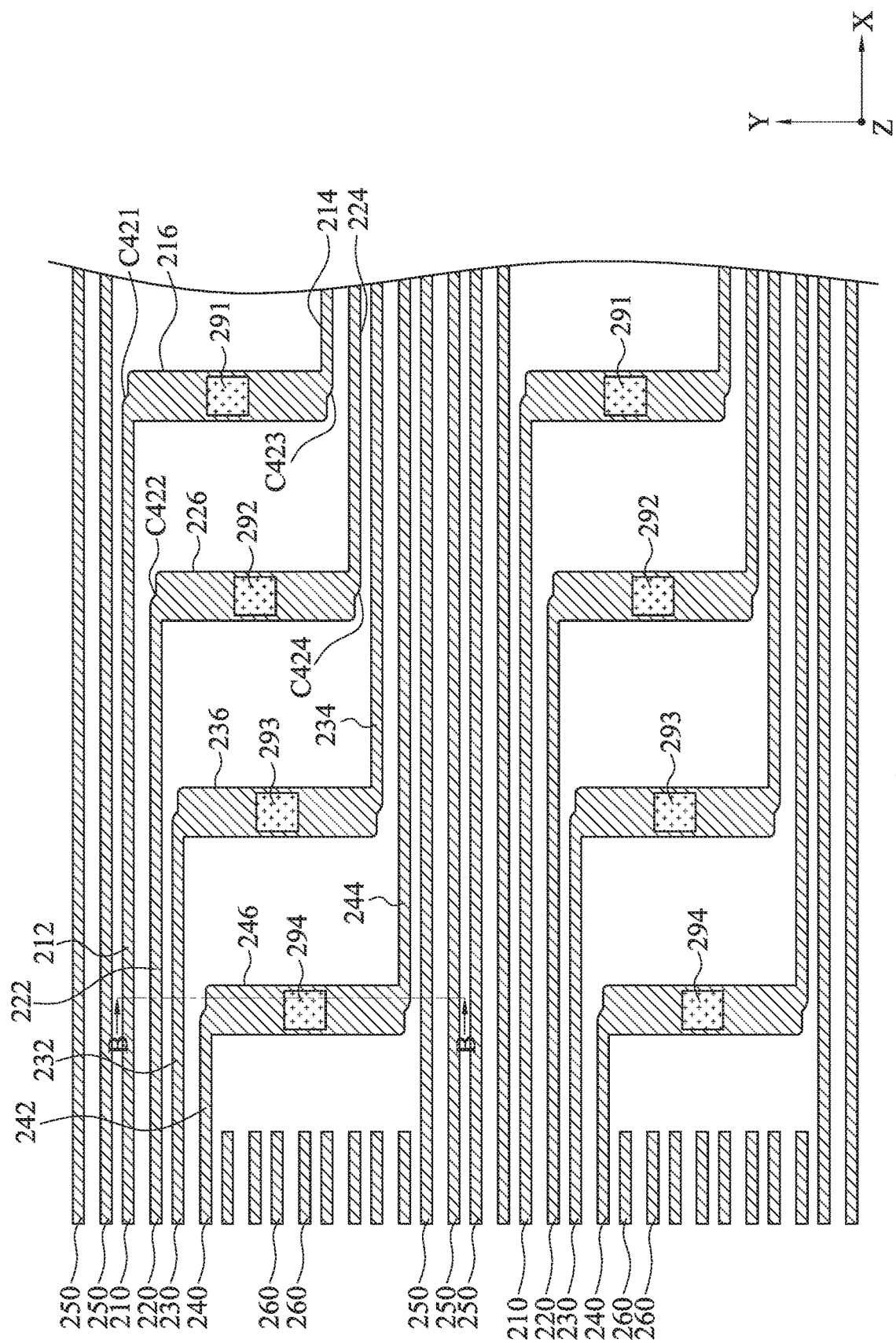
Figure 10B:
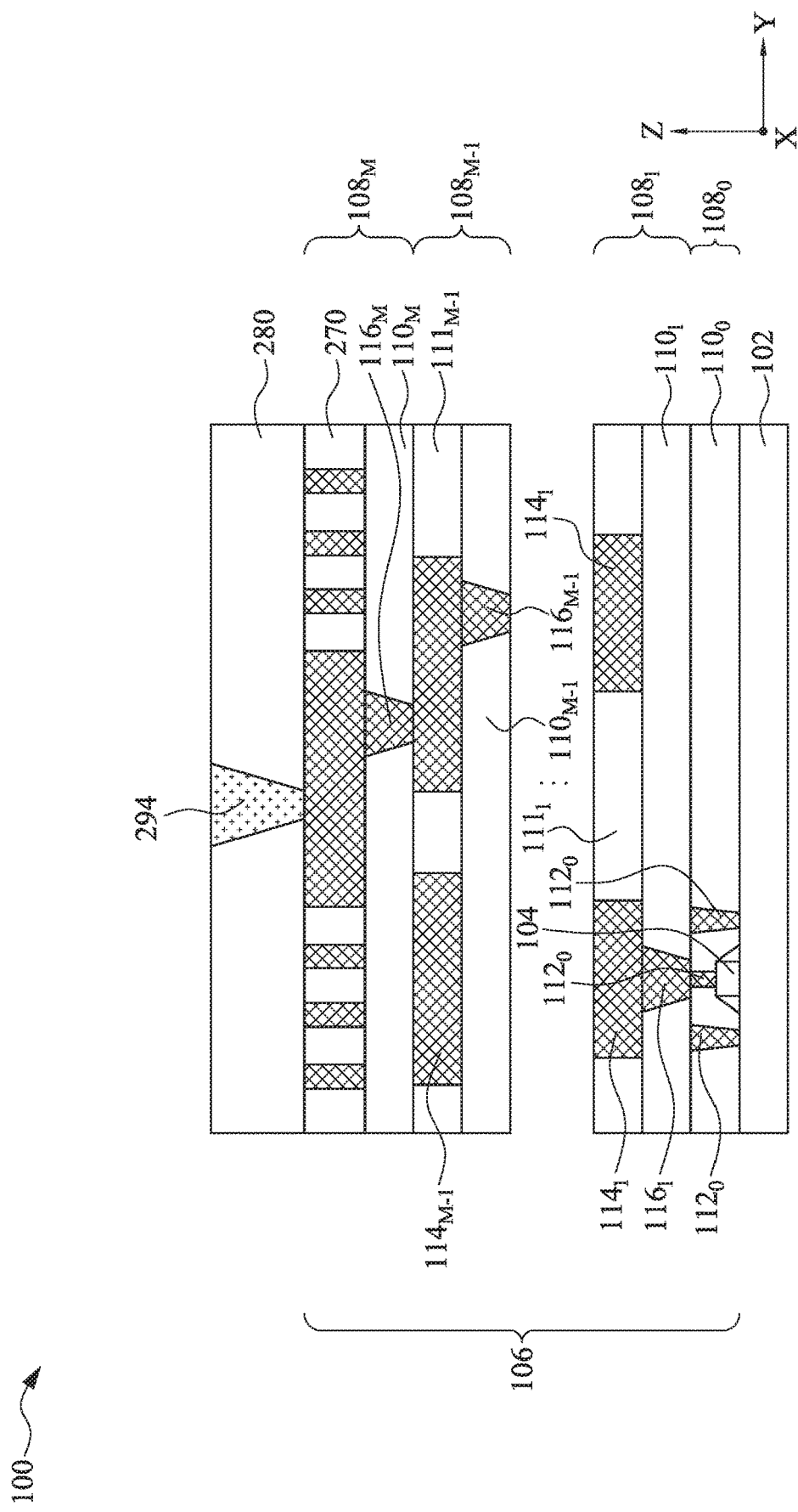

Returning to FIG. 1, the method M1 then proceeds to block S19 where conductive vias are formed over the conductive lines. Referring to FIGS. 10A and 10B, in some embodiments of block S19, an IMD layer 270 is formed among and around the conductive lines 210-260, followed by forming another IMD layer 280 over the IMD layer 270 and conductive vias 291, 292, 293 and 294 in the IMD layer 280. The conductive vias 290 land on the respective via landing portions 216, 226, 236 and 246.

In some embodiments, the IMD layers 270 and 280 have substantially the same material as the dielectric layers $110_1$ to $110_M$ and dielectric layers $111_1$ to $111_{M-1}$. For example, the IMD layers 270 and 280 may include low-k dielectric materials having k values, for example, lower than about 4.0 or even 2.0 disposed between such conductive features. In some embodiments, the ILD layer and IMD layers may be made of, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like. In some embodiments, the conductive vias 291-294 have substantially the same material as the conductive vias $116_1$ to $116_M$. For example, the conductive vias 291-294 may include copper, aluminum, tungsten, combinations thereof, or the like.

Figure 11:
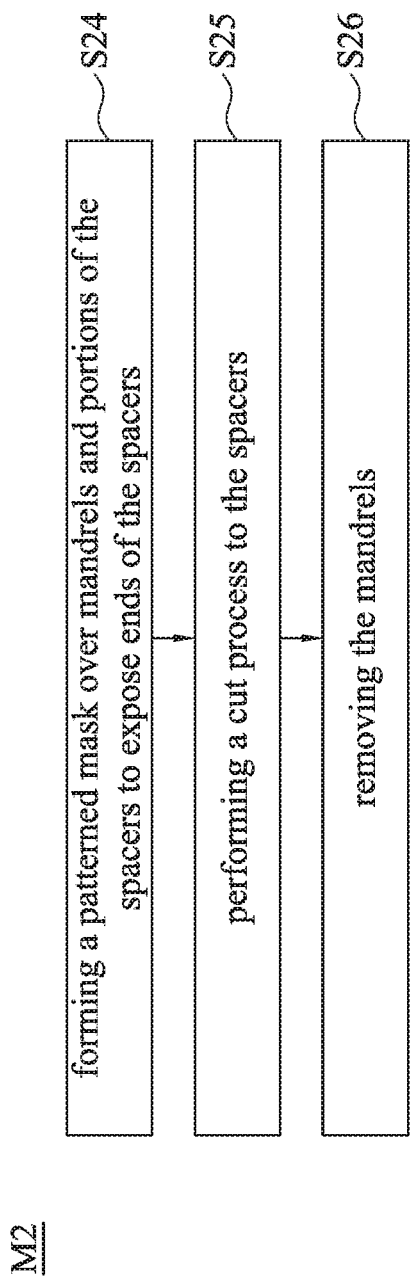
FIG. 11 is an exemplary method for fabrication of a semiconductor structure according to some embodiments of the present disclosure.

FIG. 11 is an exemplary method M2 for fabrication of a semiconductor structure according to some embodiments of the present disclosure. The method M2 includes a relevant part of the entire manufacturing process. It is understood that additional operations may be provided before, during, and after the operations shown by FIG. 11, and some of the operations described below can be replaced or eliminated for additional embodiments of the method. The order of the operations/processes may be interchangeable. FIGS. 12A-14B illustrate various intermediate stages of the method M2 in accordance with some embodiments, where an "A" figure represents a top view, a "B" figure represents a cross-sectional view along a B-B line of the respective "A" figure.

Figure 12A:
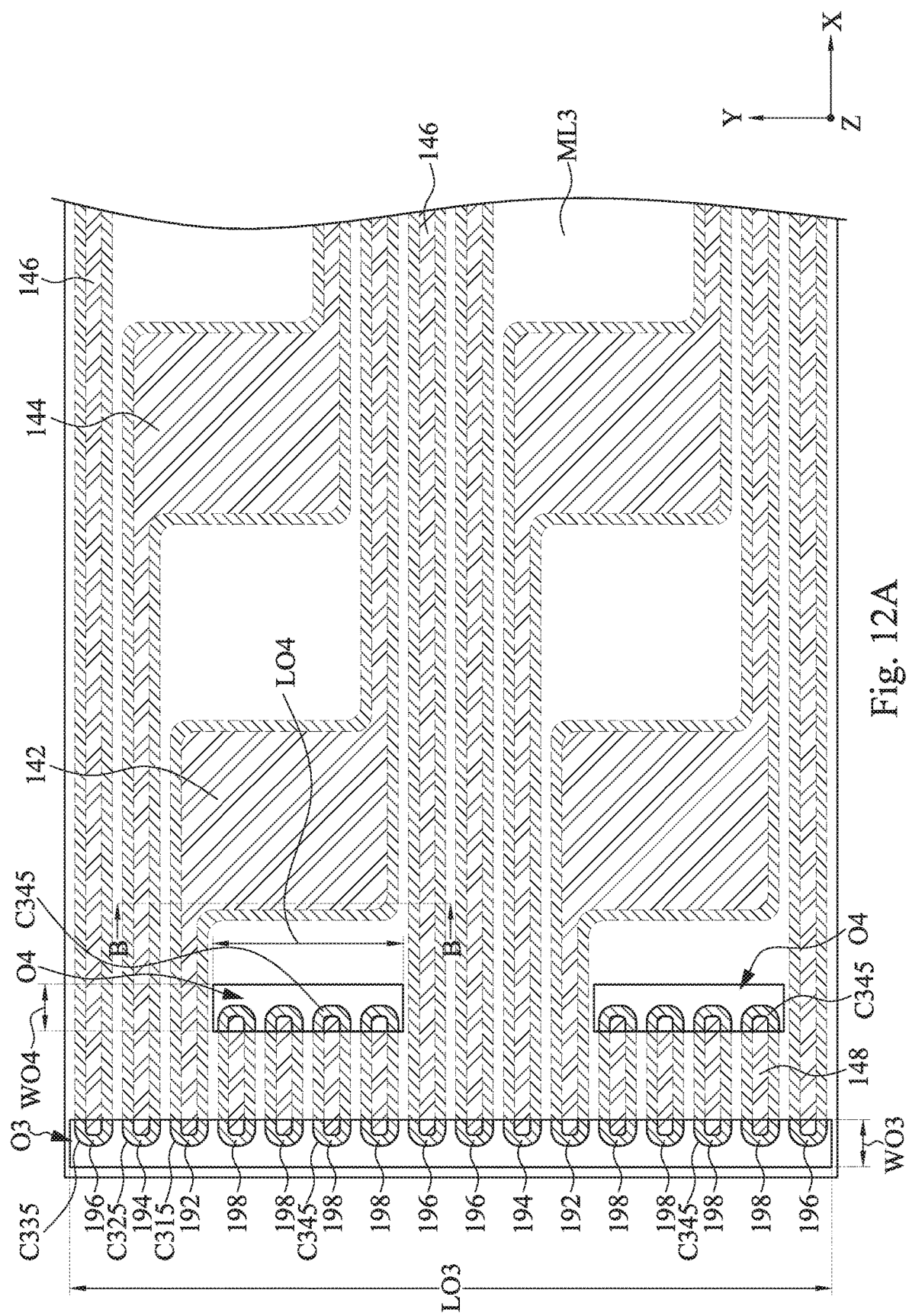
FIGS. 12A-14B illustrate various intermediate stages of the method of FIG. 11 in accordance with some embodiments.
Figure 12B:
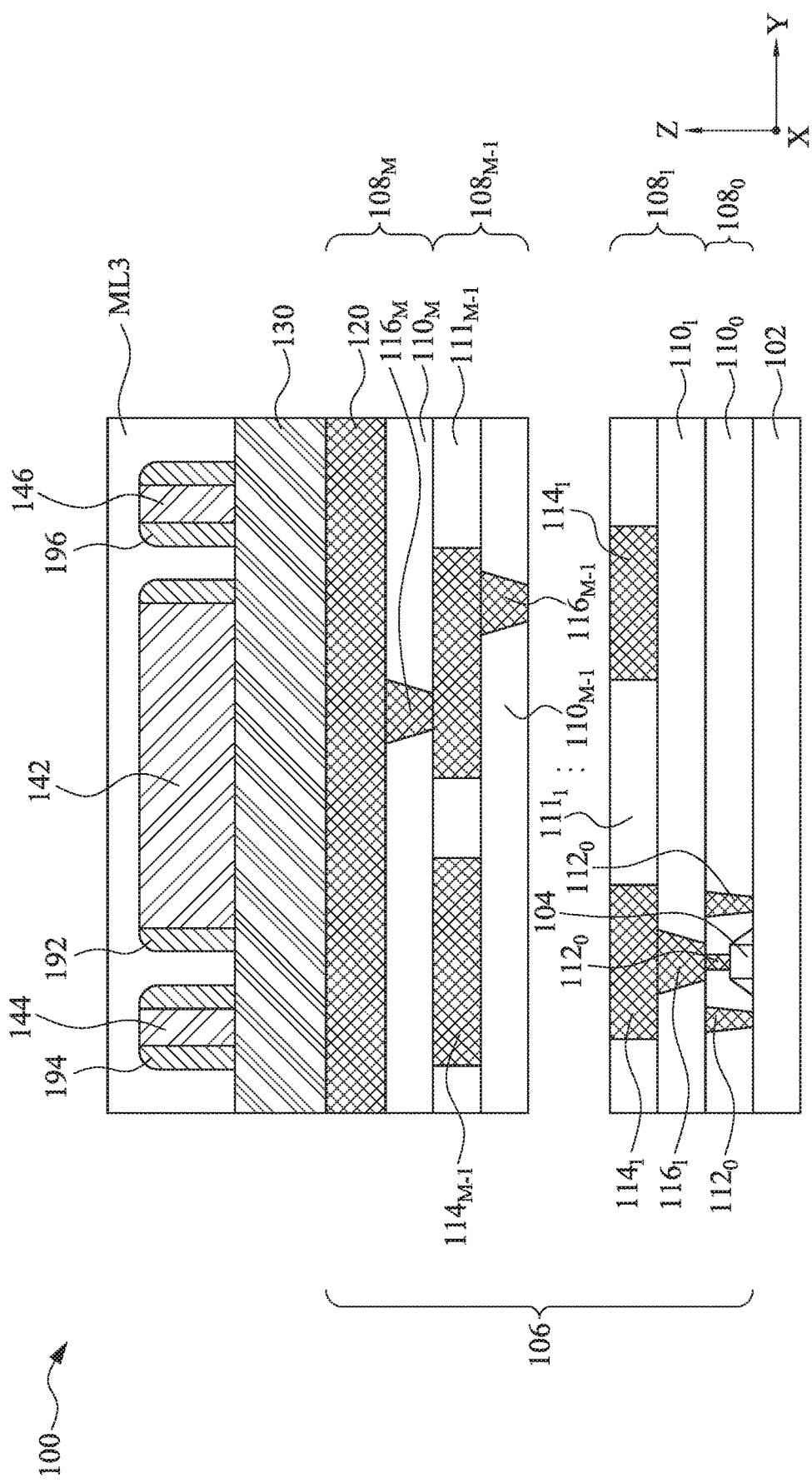

The method M2 may be performed subsequent to block S13 of the method M1. The method M2 begins at block S24 similar to block S15 of the method M1 except that block S24 is performed before removal of mandrels. For example, block S24 of the method M1 includes forming a patterned mask over the portions of the spacers and the mandrels to expose ends of the spacers. Referring to FIGS. 12A and 12B, in some embodiments of block S15, a mask layer ML3 (e.g., a photoresist) is formed over the ring-shaped spacers 192, 194, 196 and 198 and mandrels 142-148. The mask layer ML3 is then patterned (e.g., using a photolithography process) to form openings O3 and O4 to expose ends of the ring-shaped spacers 192-198. For example, the opening O3 expose rounded ends C315, C325, C335 and C345 of the corresponding ring-shaped spacers 192, 194, 196 and 198, and each of the openings O4 expose rounded ends C345 of the ring-shaped spacers 198. The opening O3 has a length LO3 in Y-direction and a width WO3 in X-direction, and the opening O4 has a length LO4 in Y-direction and a width WO4 in X-direction. In some embodiments, the length LO3 of the opening O3 is in a range from about 500 nm to about 1000 nm, the width WO3 of the opening O3 is in a range from about 100 nm to about 200 nm, the length LO4 of the opening O4 is in a range from about 200 nm to about 500 nm, and the width WO4 of the opening O4 is in a range from about 100 nm to about 200 nm, In some embodiments, the width WO3 of the opening O3 is substantially the same as the width WO4 of the opening O4.

Figure 13A:
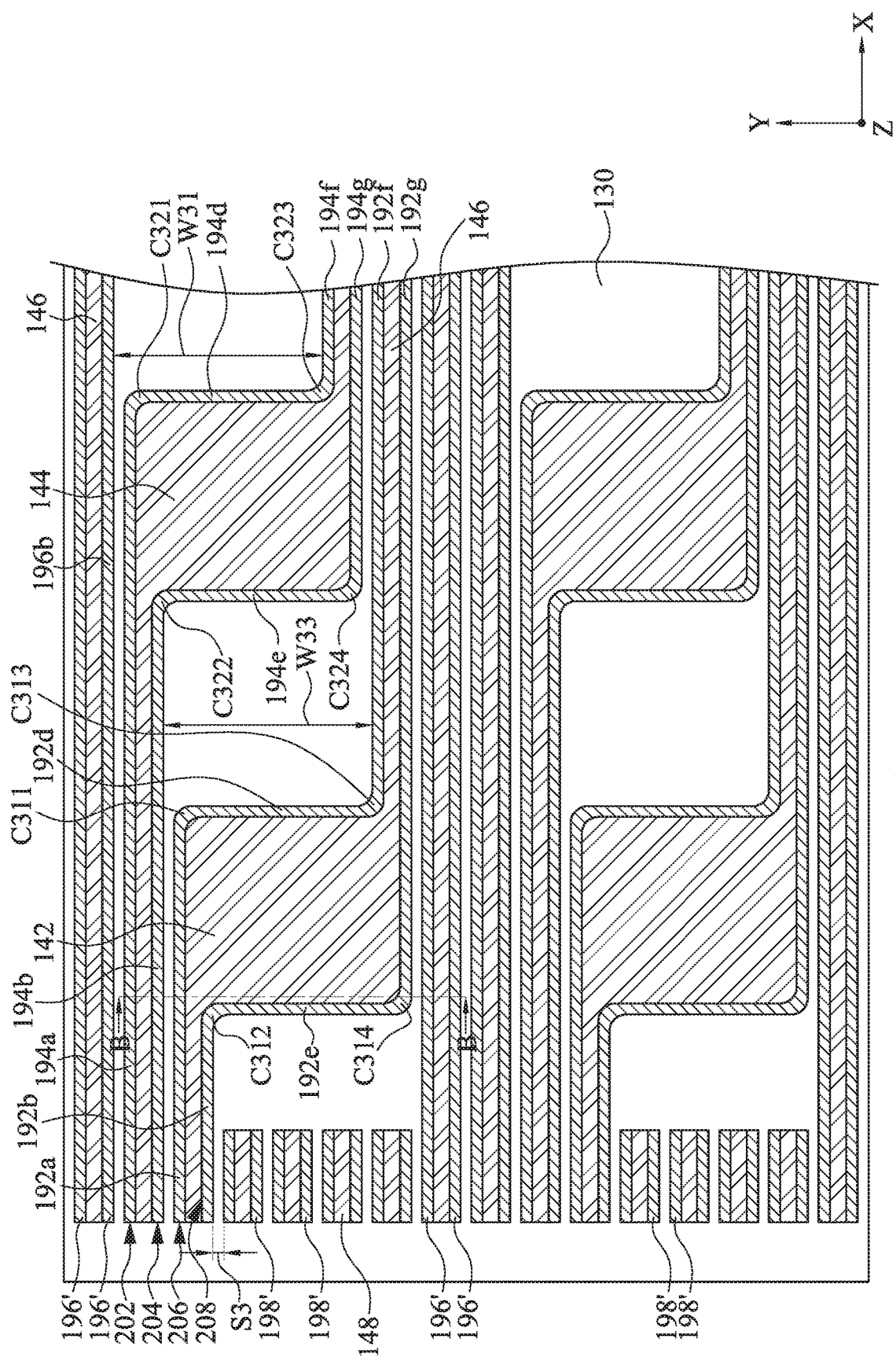
Figure 13B:
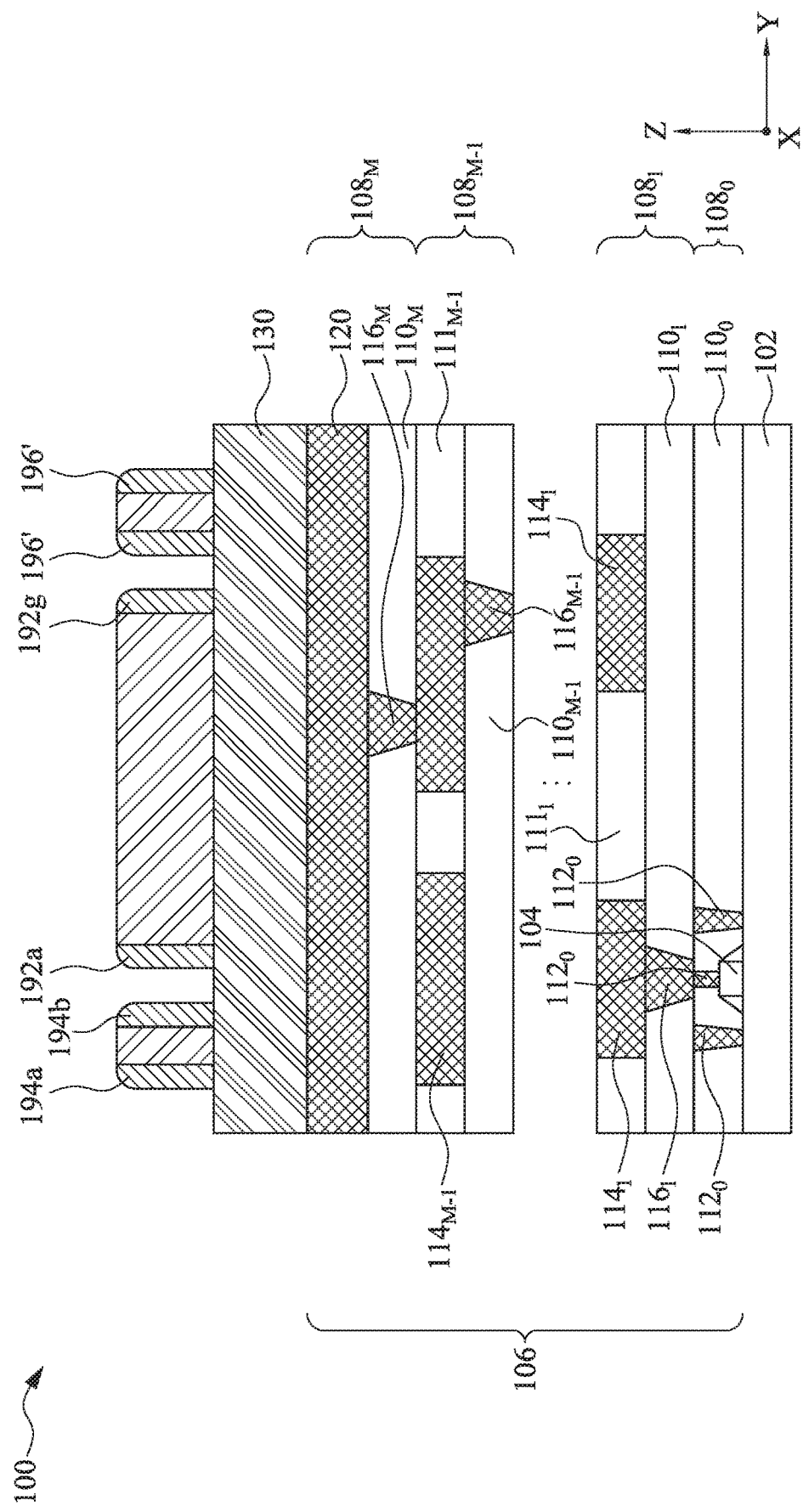

Returning to FIG. 11, the method M2 then proceeds to block S25 where a cut process is performed to the spacers. In some embodiments, the cut process may be one or more etching processes (e.g., dry etching, wet etching or combinations thereof) performed to remove the rounded ends C135, C325, C335 and C345 from the ring-shaped spacers 192, 194, 196 and 198 using the mask layer ML3 as an etching mask. Thereafter, the mask layer ML3 is removed. FIGS. 13A and 13B show a result of the cut process according to some embodiments of the present disclosure.

Figure 14A:
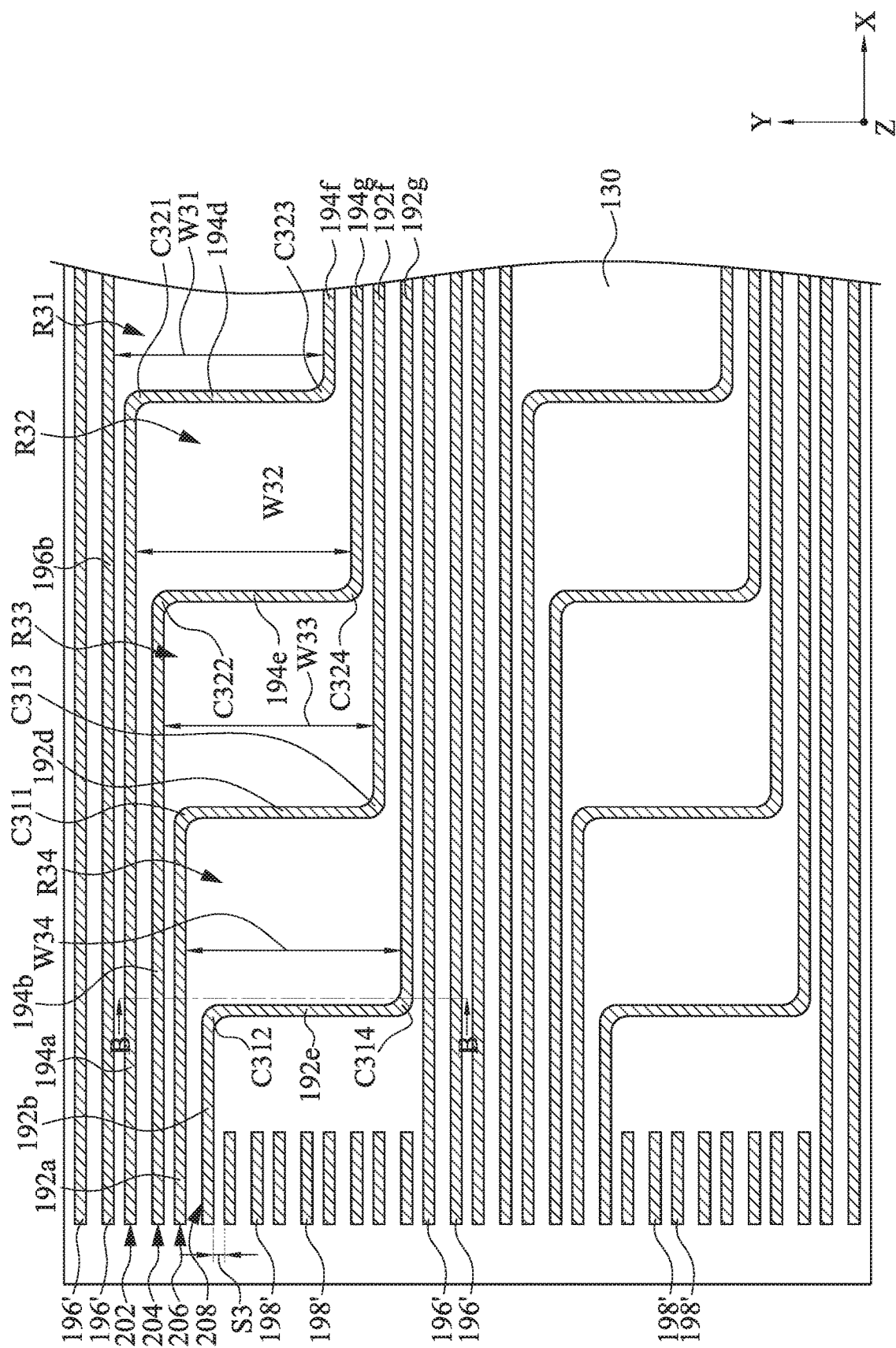
Figure 14B:
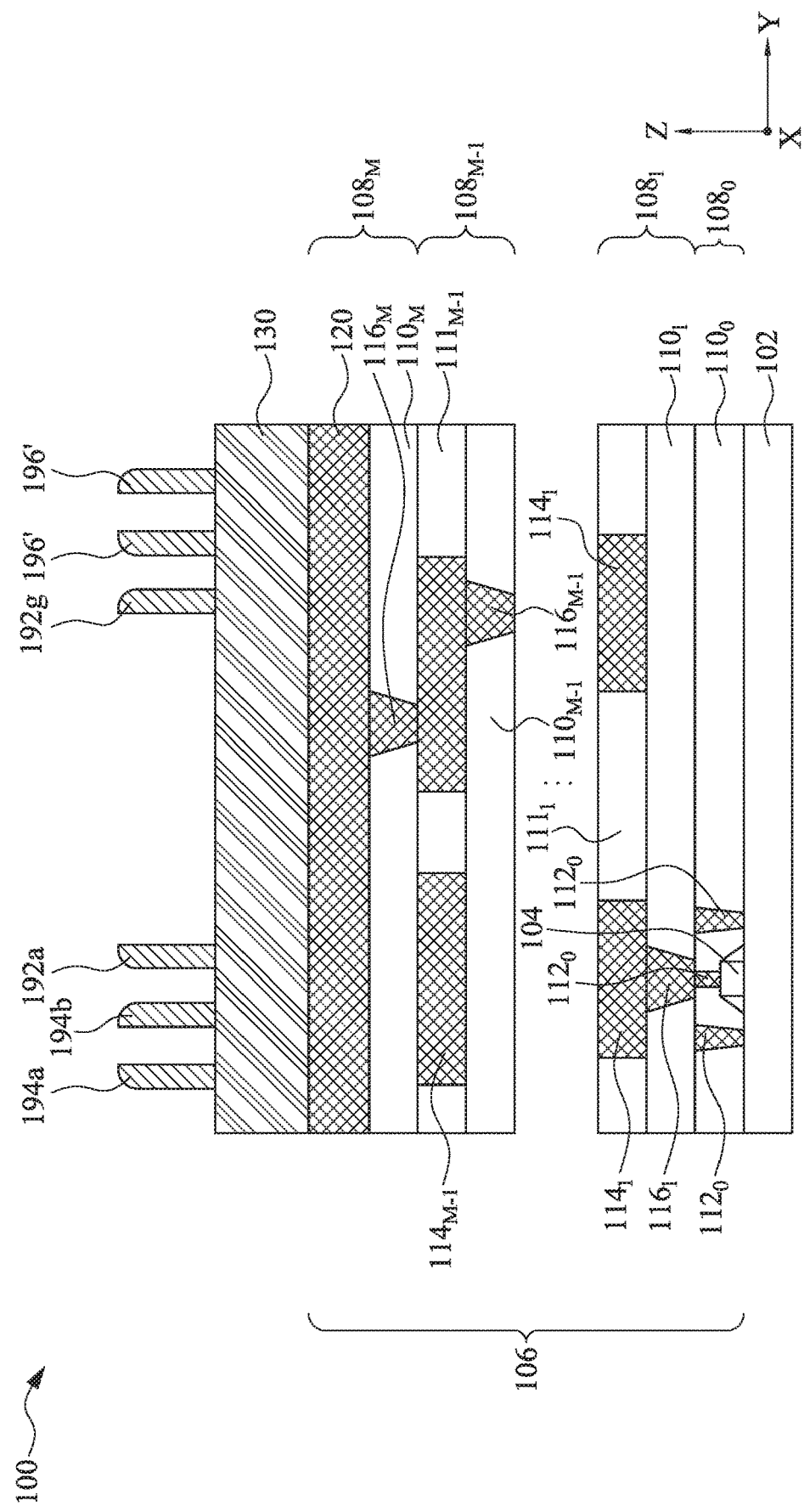

Returning to FIG. 11, the method M2 then proceeds to block S26 where the mandrels are removed. In some embodiments of block S26, mandrels 142, 144, 146 and 148 are removed by, for example, a plasma etch process, although other suitable etching process may also be used. The resulting structure is shown in FIGS. 14A and 14B. Example Etchants for removing the mandrels 142-148 are discussed previously with respect to block S14 of the method M1 and thus are not repeated herein for the sake of brevity. After block S26, blocks S17-S19 of the method M1 can be performed in such a way that the conductive lines 210-260 and conductive vias 291-294 (See FIG. 10A) can be formed.

Figure 15:
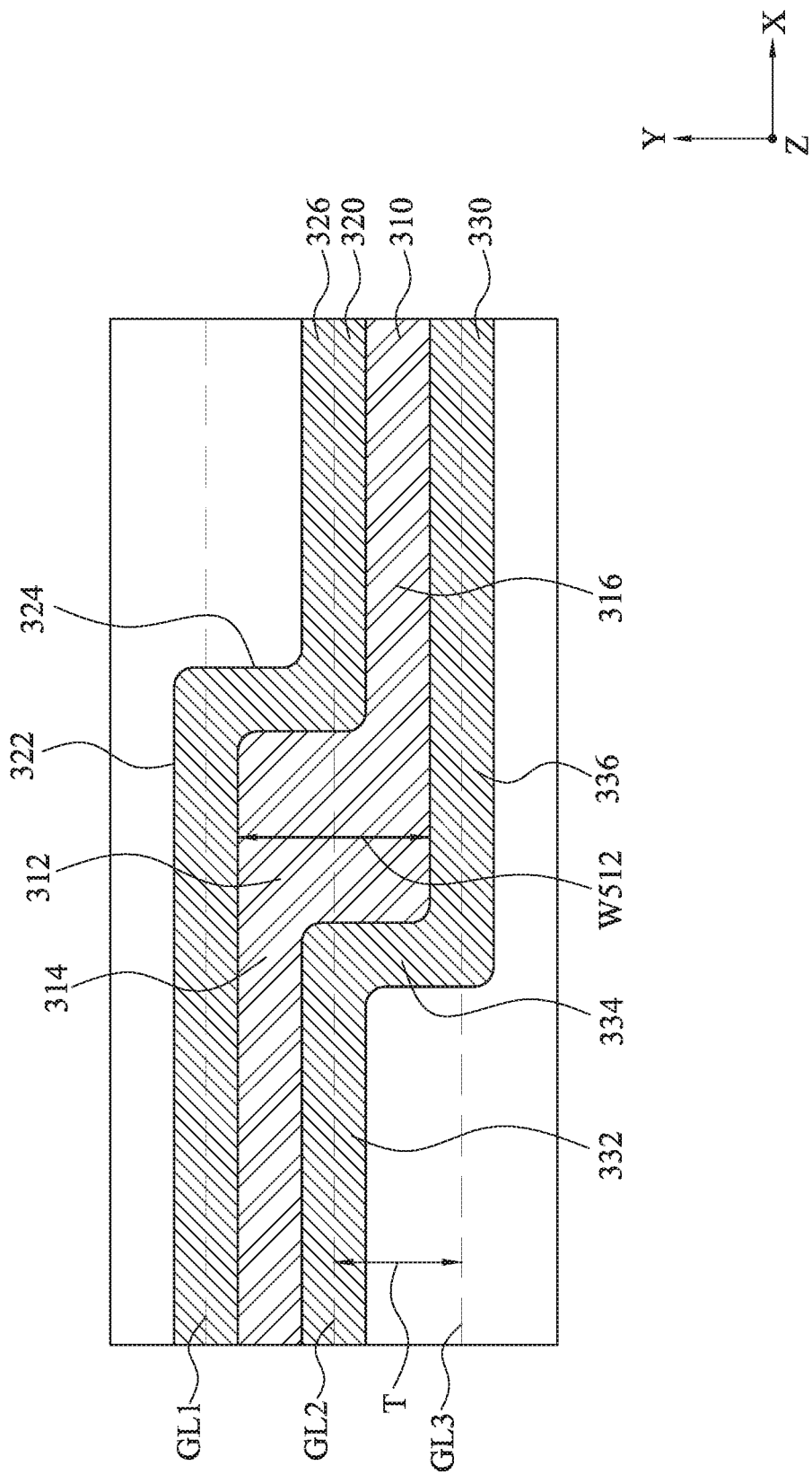
FIG. 15 illustrates a mandrel and spacers according to some embodiments of the present disclosure.

In some embodiments, a width of the rectangular mandrel as discussed above can be chosen to form one or more on-grid spacer strips (See FIG. 15) and/or one or more off-grid spacer strips (See FIG. 16), as described below in greater detail. Illustrated in FIG. 15 are virtual grid lines GL1, GL2 and GL3 arranged in parallel along X-direction. Two adjacent lines of the plurality of virtual grid lines GL1-GL3 are separated by a nominal pitch T. The nominal minimum pitch T is a predetermined minimum routing pitch of conductive lines for forming an interconnection structure according to a predetermined semiconductor manufacturing process. In some embodiments, the nominal minimum pitch T is determined according to one or more characteristics of the predetermined semiconductor manufacturing process, including a wave length for a lithographic process, a selectivity of an etching process, a material of the conductive lines, a reasonable tolerance of errors, and an expected yield rate of the predetermined semiconductor manufacturing process. For example, the nominal minimum pitch T is in a range from about 20 nm to about 100 nm. In a place and routing software tool, the conductive lines of an integrated circuit layout along the X direction are arranged (also known as "routing") according to the virtual grid lines GL1-GL3.

Also illustrated in FIG. 15 are a mandrel 310 and spacers 320 and 330 formed along opposite sidewalls of the mandrel 310. The mandrel 310 includes a rectangular mandrel island 312 and mandrel strips 314 and 316 extending in X-direction respectively from diagonal corners of the mandrel island 312. The spacer 320 includes X-directional spacer strips 322 and 326 and a Y-directional spacer strip 324 connected between the X-directional spacer strips 322 and 326. Similarly, the spacer 330 includes X-directional spacer strips 332 and 336 and a Y-directional spacer strip 334 connected between the X-directional spacer strips 332 and 336.

In some embodiments, the X-directional spacer strip 322 is on the virtual grid line GL1, the X-directional spacer strips 332 and 326 are on the virtual grid line GL2, and the X-directional spacer strip 336 is on the virtual grid line GL3. The X-directional spacer strips 322, 326, 332 and 336 can be referred to as "on-grid" spacer strips. The on-grid arrangement of these spacer strips 322, 326, 332 and 336 results at least in part from the width W512 of the rectangular mandrel island 312. For example, the width W512 of the rectangular mandrel island 312 can be chosen such that the spacer strips 322, 326, 332 and 336 are on-grid. In this way, when the pattern of the on-grid spacer strips 322, 326, 332 and 336 is transferred to an underlying conductive layer, the resulting conductive lines will be on-grid. In some embodiments, the width W512 of the rectangular mandrel island 312 is in a range from about 30 nm to about 150 nm.

Figure 16:
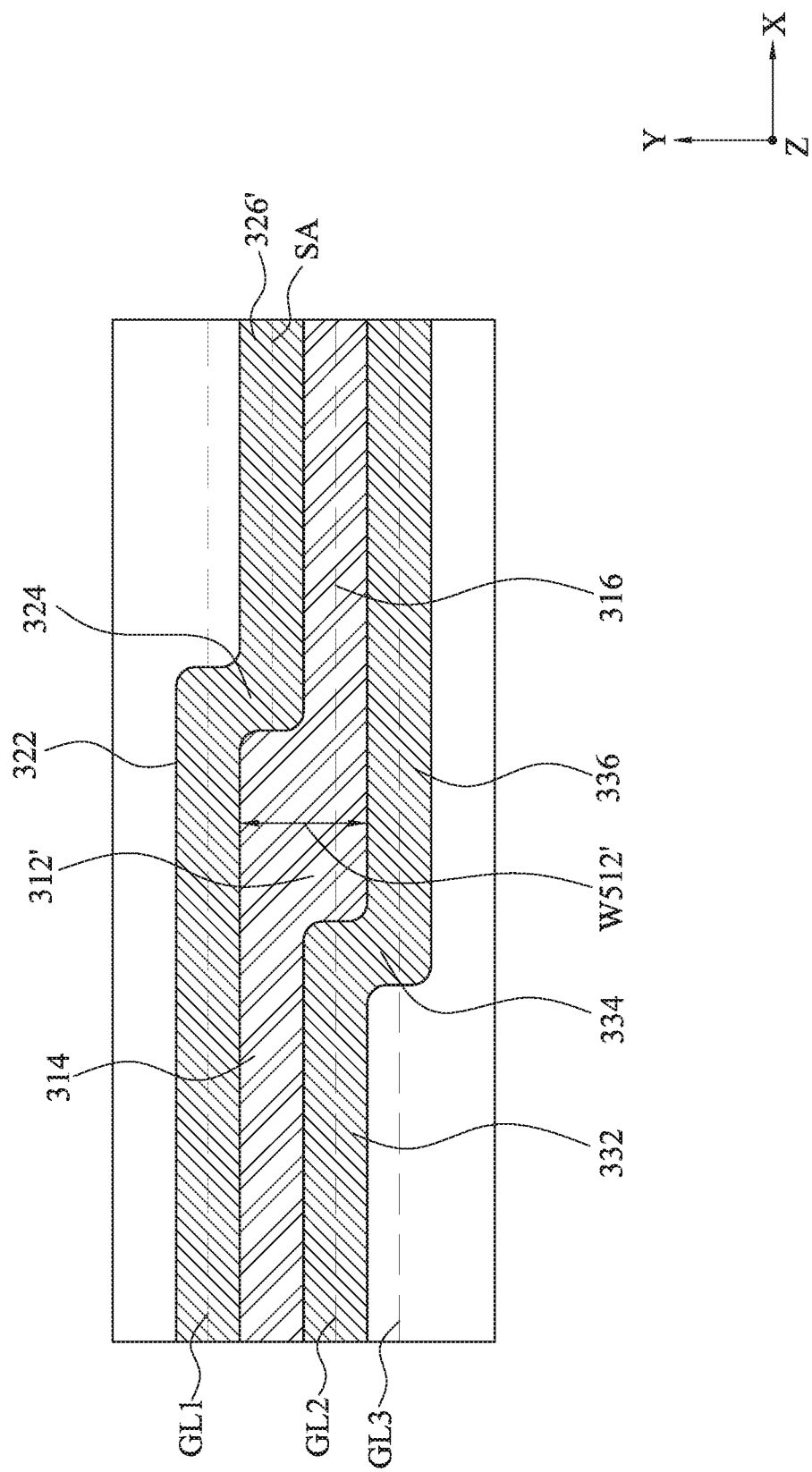
FIG. 16 illustrates a mandrel and spacers according to some embodiments of the present disclosure.

FIG. 16 illustrates similar mandrel and spacers to FIG. 15 except that the spacer strip 326' is offset from the grid line GL2. For example, the spacer strip 326' has a symmetric axis SA offset from the grid line GL2. In greater detail, the spacer strip 326' is not on any of the virtual grid lines GL1-GL3 (i.e., off-grid). The off-grid arrangement of the spacer strip 326' results at least in part from the width W512' of the rectangular mandrel island 312'. For example, the width W512' of the rectangular mandrel island 312' can be chosen such that the spacer strip 326' is off-grid. In this way, when the pattern of the on-grid spacer strip 326' is transferred to an underlying conductive layer, the resulting conductive line will be off-grid. In some embodiments, the width W512' of the rectangular mandrel island 312' is in a range from about 20 nm to about 100 nm.

As illustrated in FIGS. 15 and 16, the width of the rectangular mandrel island can be chosen to result in an on-grid spacer strip or an off-grid spacer strip, which in turn will lead to an on-grid conductive line or an off-grid conductive line. As a result, the rectangular mandrel island can improve flexibility for designing a layout of spacer strips and/or conductive lines.

The formation methods of conductive lines in the BEOL process as discussed above are some examples for describing the mandrel having a rectangular island. The rectangular mandrel island concepts described above can also be integrated into SADP hard mask formation for front-end-of-line (FEOL) devices, logic devices and/or memory devices. Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that removal of spacer strips from rectangular regions can be omitted, which in turn will reduce unwanted spacer damage or spacer residues resulting from, for example, photolithographic overlay misalignment in the removal process. The photolithographic overlay window and the etching process window are thus improved. Another advantage is that on-grid spacer strips or off-grid spacer strips can be achieved by choosing the width of the rectangular mandrel islands.

According to some embodiments, a method comprises following steps. A first mandrel is formed over a target layer over a substrate, wherein the first mandrel comprises a mandrel island and a first mandrel strip, the mandrel island comprises a first sidewall and a second sidewall perpendicular to the first sidewall, and the first mandrel strip extends from the first sidewall of the mandrel island. A first spacer is formed along the first and second sidewalls of the mandrel island and a sidewall of the first mandrel strip. The first mandrel is removed from the target layer. The target layer is patterned when the first spacer remains over the target layer.

According to some embodiments, a method comprises following steps. A first mandrel is formed over a target layer over a substrate, wherein the first mandrel comprises a first mandrel island, a first mandrel strip and a second mandrel strip, wherein first mandrel island comprises a first sidewall and a second sidewall opposite to the first sidewall, the first and second mandrel strips respectively extend from the first and second sidewalls of the first mandrel island and are misaligned. A first spacer is formed extending along sidewalls of the first mandrel strip, the first mandrel island and the second mandrel strip. The first mandrel is removed from the target layer. The target layer is etched using at least the first spacer as an etching mask.

According to some embodiments, a semiconductor structure includes a semiconductor substrate, an IMD layer, a first conductive via, a conductive line and a second conductive via. The IMD layer is over the semiconductor substrate. The first conductive via is in the IMD layer. The conductive line is over the first conductive via, wherein the conductive line comprises a first strip portion, a via landing portion and a first rounded corner connecting the first strip portion and the via landing portion, wherein the first rounded corner has an obtuse corner angle when viewed from above the conductive line. The second conductive via is over the via landing portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first mandrel over a target layer over a substrate, wherein the first mandrel comprises a mandrel island and a first mandrel strip, the mandrel island comprises a first sidewall and a second sidewall perpendicular to the first sidewall, and the first mandrel strip extends from the first sidewall of the mandrel island;
   forming a first spacer along the first and second sidewalls of the mandrel island and a sidewall of the first mandrel strip;
   removing the first mandrel; and
   patterning the target layer with the first spacer remains over the target layer;
   wherein the first mandrel further comprises a second mandrel strip extending from a third sidewall of the mandrel island facing away from the first sidewall, and forming the first spacer is performed such that first and second spacer strips of the first spacer are respectively formed along the first and second mandrel strips and are misaligned from each other.

2. The method of claim 1, wherein a second mandrel is formed adjacent to the first mandrel when forming the first mandrel.

3. The method of claim 1, wherein forming the first spacer is performed such that a third spacer strip of the first spacer is formed along the first sidewall of the mandrel island, and the method further comprises:
   forming a mask to cover the third spacer strip of the first spacer, wherein patterning the target layer is performed after forming the mask.

4. The method of claim 3, wherein after patterning the target layer, a portion of the patterned target layer under the mask remains over the substrate, and the method further comprises:
   forming a conductive via over the portion of the patterned target layer.

5. The method of claim 1, forming the first spacer is performed such that a second spacer is formed along the third sidewall of the mandrel island, and patterning the target layer is performed when the second spacer remains over the target layer.

6. The method of claim 5, wherein forming the second spacer is performed such that first and second spacer strips of the second spacer are respectively along the first and second mandrel strips and are misaligned.

7. The method of claim 6, wherein forming the second spacer is performed such that a third spacer strip of the second spacer is formed along the third sidewall of the mandrel island, and the method further comprises:
   forming a mask to cover the third spacer strip of the second spacer, wherein patterning the target layer is performed after forming the mask.

8. The method of claim 1, wherein forming the first spacer comprises:
   forming a ring-shaped spacer around the first mandrel, wherein the ring-shaped spacer comprises a rounded end around an end of the first mandrel strip and a rounded corner around a corner of the mandrel island; and
   removing the rounded end of the ring-shaped spacer, wherein the rounded corner of the ring-shaped spacer remains around the corner of the mandrel island after removing the rounded end.

9. A method, comprising:
   forming a first mandrel over a target layer over a substrate, wherein the first mandrel comprises a first mandrel island, a first mandrel strip and a second mandrel strip, wherein the first mandrel island comprises a first sidewall and a second sidewall opposite to the first sidewall, the first and second mandrel strips respectively extend from the first and second sidewalls of the first mandrel island and are misaligned;

forming a first spacer extending along sidewalls of the first mandrel strip, the first mandrel island and the second mandrel strip;

removing the first mandrel; and etching the target layer using at least the first spacer as an etching mask;

wherein forming the first mandrel is performed such that a third mandrel strip is formed adjacent to the first mandrel, wherein the third mandrel strip has a length greater than a length of a combination of the first mandrel island and the first mandrel strip.

10. The method of claim 9, wherein forming the first mandrel is performed such that a second mandrel island is formed connected to the third mandrel strip, wherein a region between the first mandrel island and the second mandrel island is free from a material of the first mandrel, and the region has a width greater than a spacing between the first mandrel strip and the third mandrel strip.

11. The method of claim 9, wherein forming the first spacer is performed such that a second spacer is formed extending along the third mandrel strip, the first spacer comprises a first spacer strip in contact with the first mandrel strip and a second spacer strip in contact with the second mandrel strip, and a distance between the first spacer strip and the second spacer is less than a distance between the second spacer strip and the second spacer.

12. The method of claim 11, wherein forming the first mandrel is performed such that a second mandrel island is formed connected to the third mandrel strip, wherein forming the second spacer is performed such that the second spacer has a third spacer strip along the third mandrel strip and a fourth spacer strip along the second mandrel island and perpendicular to the first spacer strip, and the method further comprises:

forming a mask to cover the fourth spacer strip prior to etching the target layer.

13. The method of claim 12, wherein the third spacer strip is free from coverage by the mask.

14. The method of claim 9, where forming the first spacer is performed such that the first spacer comprises a first spacer strip extending along the first mandrel strip, a second spacer strip extending along the first mandrel island, and a third spacer strip extending along the second mandrel strip, and the method further comprises:

forming a mask to cover the second spacer strip prior to etching the target layer.

15. The method of claim 14, wherein the first and third spacer strips are free from coverage by the mask.

16. The method of claim 14, wherein after etching the target layer, a via landing portion of the target layer remains over the substrate and has a pattern substantially the same as a pattern of the mask.

17. A semiconductor structure, comprising:
a semiconductor substrate;
an inter-metal dielectric (IMD) layer over the semiconductor substrate;
a first conductive via in the IMD layer;
a conductive line over the first conductive via, wherein the conductive line comprises a first strip portion, a via landing portion, and a first rounded-corner connecting straight sidewalls of the first strip portion and the via landing portion when viewed from above the conductive line; and
a second conductive via over the via landing portion.

18. The semiconductor structure of claim 17, wherein the conductive line further comprises a second strip portion and a second rounded corner, the via landing portion is between the first and second strip portions, and the second rounded corner connects the second strip portion and the via landing portion, wherein the second rounded corner has an obtuse corner angle when viewed from above the conductive line.

19. The method of claim 2, wherein a distance between the first mandrel strip and the second mandrel is different from a distance between the second mandrel strip and the second mandrel.

20. The method of claim 16, further comprising forming a conductive via over the via landing portion.

* * * * *